United States Patent
Lagakos et al.

(10) Patent No.: US 9,823,277 B1
(45) Date of Patent: Nov. 21, 2017

(54) FIBER OPTIC ELECTROMAGNETIC PHENOMENA SENSORS

(71) Applicant: Fiber Optic Sensor Systems Technology Corporation, Washington, DC (US)

(72) Inventors: Nicholas Lagakos, Silver Spring, MD (US); Victor Kaybulkin, Chantilly, VA (US); Patrick Hernandez, Silver Spring, MD (US); Christopher Vizas, Washington, DC (US)

(73) Assignee: FIBER OPTIC SENSOR SYSTEMS TECHNOLOGY CORPORATION, Washington, DC (US)

( * ) Notice: Subject to any disclaimer, the term of this patent is extended or adjusted under 35 U.S.C. 154(b) by 305 days.

(21) Appl. No.: 14/222,225

(22) Filed: Mar. 21, 2014

(51) Int. Cl.
*G01R 19/00* (2006.01)
*G01R 33/032* (2006.01)

(52) U.S. Cl.
CPC ..... *G01R 19/0092* (2013.01); *G01R 33/0327* (2013.01)

(58) Field of Classification Search
CPC .......... G01B 11/14; G01B 9/02; G01D 5/266; G01V 1/162; G01V 8/12; G01V 7/00; G01V 7/02; G01V 8/10; G01V 3/30
USPC ....................................................... 324/614
See application file for complete search history.

(56) References Cited

U.S. PATENT DOCUMENTS

| | | | |
|---|---|---|---|
| 4,749,856 A * | 6/1988 | Walker | G01K 11/18 250/227.11 |
| 5,400,142 A | 3/1995 | Lavin | |
| 5,631,559 A | 5/1997 | Oliver | |
| 6,411,215 B1 * | 6/2002 | Shnier | E05B 17/22 250/221 |
| 6,621,258 B2 | 9/2003 | Davidson | |
| 7,020,354 B2 | 3/2006 | Lagakos | |
| 7,149,374 B2 | 12/2006 | Lagakos | |
| 7,327,512 B2 | 2/2008 | Watanabe | |
| 7,379,630 B2 | 5/2008 | Lagakos | |
| 7,460,740 B2 | 12/2008 | Lagakos | |
| 7,646,946 B2 | 1/2010 | Lagakos | |
| 7,697,798 B2 | 4/2010 | Lagakos | |
| 7,714,735 B2 | 5/2010 | Rockwell | |
| 7,786,719 B2 | 8/2010 | Kurosawa | |
| 8,195,013 B2 | 6/2012 | Lagakos | |

(Continued)

*Primary Examiner* — Jermele M Hollington
*Assistant Examiner* — Zannatul Ferdous
(74) *Attorney, Agent, or Firm* — Hogan Lovells US LLP

(57) ABSTRACT

A fiber optic sensor for measuring electromagnetic phenomena, including electrical and magnetic fields, voltage, and current is disclosed. The sensor includes an optical fiber probe containing a transmitting fiber and at least one receiving fiber, and a reflective surface or body. The reflective surface or body may be part of or attached to a material exhibiting a physical displacement from a force exerted upon the material due to electromagnetic phenomena, such as an electrical field, a magnetic field, voltage, and current. The reflective surface may be spaced apart from the ends of the fibers in the probe, and positioned so that light transmitted through the transmitting fiber is reflected by that surface into at least one receiving fiber. A light sensing means is coupled to the at least one receiving fiber, so light from a light reflected by the reflector body back into the receiving fibers is detected.

41 Claims, 17 Drawing Sheets

(56) References Cited

U.S. PATENT DOCUMENTS

2014/0022557 A1* 1/2014 Carr .................. G01D 5/266
356/614
2015/0128706 A1* 5/2015 Godfrey ............. G01M 11/088
73/574

* cited by examiner

FIBER OPTIC ELECTROMAGNETIC PHENOMENA SENSORS

FIELD OF INVENTION

This invention relates in general to fiber optic sensors for measuring electromagnetic phenomena, including electrical and magnetic fields, voltage, and current.

BACKGROUND

In recent years, fiber optics have formed the basis for many different types of sensors, such as pressure sensors, strain sensors, and others. Optical fiber sensors can use phase, polarity or intensity modulation. Intensity modulation yields fiber optic sensors that are simpler and less expensive. The theory of intensity modulated optical fiber sensors, and examples of such sensors, are disclosed in the U.S. Government-owned inventions by Nicholas Lagakos et al., described in U.S. Pat. No. 7,020,354: Intensity Modulated Fiber Optic Pressure Sensor, Navy Case No. 83,816; U.S. Pat. No. 7,149,374: Fiber Optic Pressure Sensor, Navy Case No. 84,557; U.S. Pat. No. 7,379,630: Multiplexed Fiber Optic Sensor System, Navy Case No. 97,488; U.S. Pat. No. 7,460,740: Intensity Modulated Fiber Optic Static Pressure Sensor System, Navy Case No. 97,279; U.S. Pat. No. 7,646,946: Intensity Modulated Fiber Optic Strain Sensor, Navy Case No. 97,005; U.S. Pat. No. 7,697,798: Fiber Optic Pressure Sensors and Catheters, Navy Case No. 97,569; U.S. Pat. No. 8,195,013: Miniature Fiber Optic Temperature Sensors, Navy Case No. 98,030 (collectively, the "U.S. Government Patents"). The disclosures of the U.S. Government Patents are incorporated herein by reference.

Electrical power monitoring and control systems require specialized sensor devices. The requirements associated with such sensors are determined by the particular monitoring and control approach employed, as well as the kind of performance expected of the monitoring or controlling system. A common type of electromagnetic sensor are instrument transformers, which measure current and voltage in a circuit when the electrical potential or current is too high to be applied directly to the measuring instruments. These transformers operate to reduce the current or voltage that is proportional to the current or voltage in the circuit, which can then be connected to measuring and control instruments. While electro-mechanical instrument transformers have been in use in electric power systems for many years, the accuracy of these devices is limited by a number of factors which impose significant measurement errors in actual use. In addition, these devices are often physically complex, are sensitive to electromagnetic interference (EMI), can be dangerous to humans in operation, and aren't physically robust.

One solution is to employ measurement devices that use fiber optics for measurement. The use of fiber optics for sensors in general, and for electromagnetic measurements in particular, is an alternative that addresses the accuracy, EMI sensitivity, safety, size, and robustness concerns inherent in existing electro-mechanical electric system measurement. Since fiber optics use light rather than electricity, a fiber optic sensor is generally insensitive to EMI and is therefore more efficient in an environment that has a large amount of electromagnetic energy. As a result, fiber optic sensors can be located adjacent to or attached to circuits that generate large electro-magnetic fields without negative effects to either the measurement or the measuring equipment.

One known approach has been to use fiber optic sensor devices to measure changes in light phase and polarity that indicate various electric and magnetic phenomena that are produced by the Farraday, Kerr, and Pockels effects. See, e.g., U.S. Pat. Nos. 7,714,735; 7,786,719; 7,327,512; 6,621,258; 5,631,559; and 5,400,142. These techniques rely upon mechanisms by which electromagnetic properties in an area of interest can be measured by observing the interaction between light and an electromagnetic field in a given material, such as a length of fiber optic cable. The rotation of the plane of polarization of light passed through an optical fiber subjected to an electromagnetic field is indicative of the intensity of that field. However, performance of these devices is limited by the accuracy with which the change in polarization of the light can be measured, which requires specialized light polarization and filtration devices that must remain properly calibrated, which raises the complexity and lifetime costs associated with these devices. These devices also are sensitive to temperature effects.

Intensity modulated fiber optic sensors are an alternative means of achieving accurate measurement of electromagnetic phenomena that have the benefit of being simpler and less expensive than existing methods. Therefore it is an object of this invention to offer an intensity modulated fiber optic electromagnetic phenomena sensor that is: highly accurate; may be used in areas with high potential for EMI; physically robust; and physically simple.

SUMMARY OF THE INVENTION

An aspect of the invention is directed to a fiber optic sensor for measuring electromagnetic phenomena, including electrical and magnetic fields, voltage, and current. The sensors described herein use intensity modulated optical fiber sensor technology to measure electromagnetic phenomena.

The sensor includes an optical fiber probe including a transmitting fiber and at least one receiving fiber, a reflective surface or body that is a part of or is attached to a material that exhibits a physical displacement due to a force exerted upon the material due to an electromagnetic phenomena, such as an electrical field, a magnetic field, voltage, and current. The reflective surface is spaced apart from the ends of the fibers and positioned so that light, transmitted through the transmitting fiber, is reflected by that surface into at least one receiving fiber. A light sensing means is coupled to the second end of the at least one receiving fiber, so that in operation light from a light source, launched into the transmitting fiber, propagates through the fiber and emerges at the end, propagates a short distance from the end of the fiber, and is reflected at least partially by the reflector body back into the receiving fibers, the reflected light then propagates through the receiving fibers, and the light is detected by the light sensing means.

In operation, the physical displacement in the material is caused by a force exerted upon the material due to an electromagnetic phenomena, with embodiments that can be selected whereby the electric or magnetic field, voltage, or current is isolated for measurement. The physical displacement causes a change in the distance between the fiber ends and the reflective surface, modulating the amount of light received in the receiving fiber or fibers. The intensity of the light received is thereby modulated in relation to the intensity of electromagnetic phenomena measured, with the embodiment selected so as to isolate an electric field or magnetic field (and thus a corresponding voltage or current, respectively) for measurement. Thus, the presence of the electromagnetic phenomena is indicated by the physical displacement of the material in response to the force, and the displacement of the material is measured by the amount of light detected by the light detecting means.

DETAILED DESCRIPTION OF THE INVENTION

Figure 1:
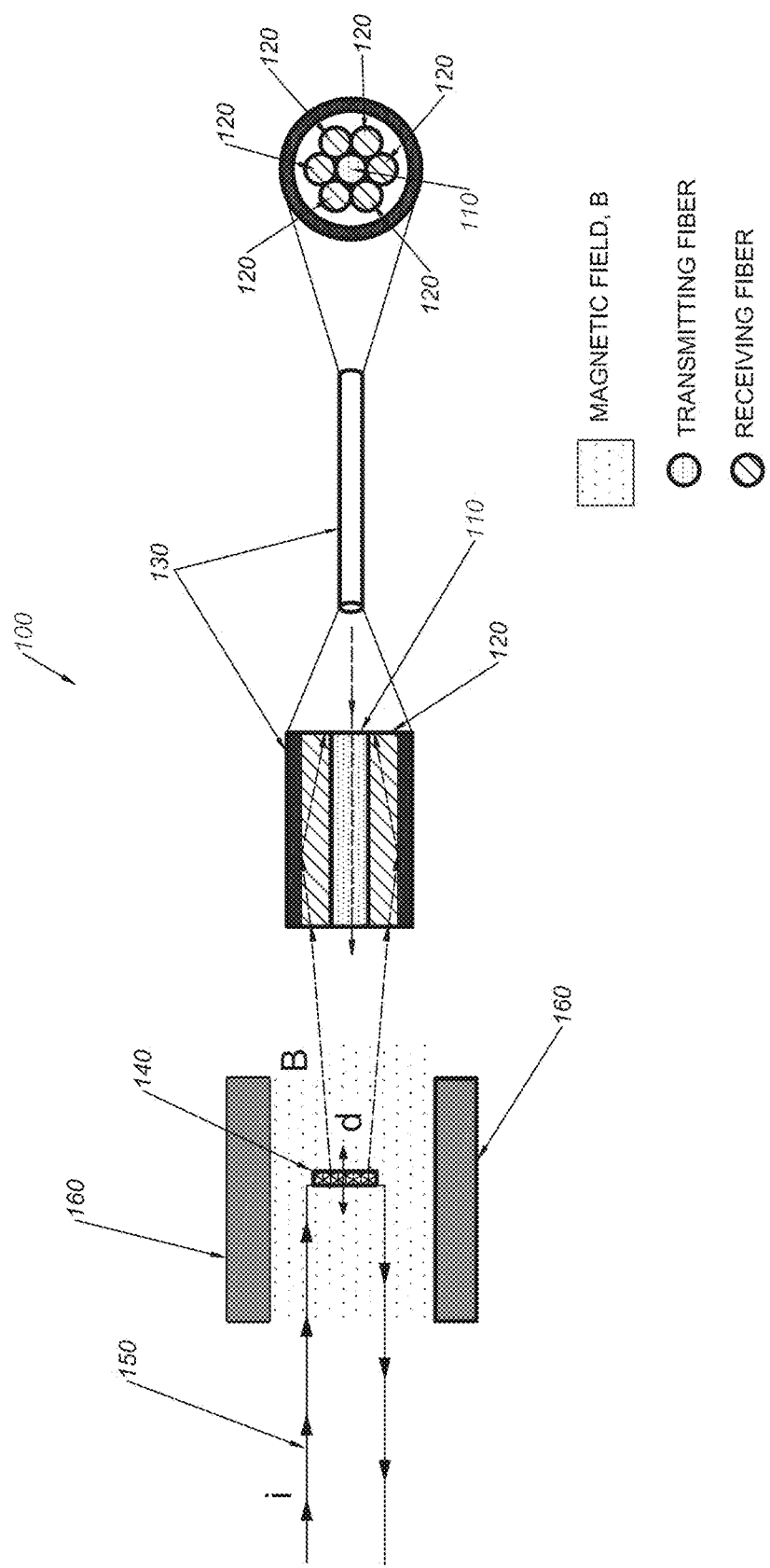
FIG. 1 shows an embodiment of a fiber optic electromagnetic phenomena sensor, configured to measure current.

The principle of operation of each of the fiber optic electromagnetic phenomena sensors described herein share common characteristics. A fiber optic probe, consisting of a transmitting fiber for transmitting light and at least one receiving fiber for receiving light is placed adjacent to a reflective surface, with space between the probe end and the reflective surface. The reflective surface is either a part of, or is attached to, a material that exhibits a physical displacement in response to an electromagnetic phenomena. Many electromagnetic phenomena are known that will cause a physical force upon a material when that material is exposed to an electric field, magnetic field, voltage, or current. The physical force exerted upon the material due to the electromagnetic phenomena causes a physical displacement of the material that can be measured.

The physical displacement in the material in response to the electromagnetic phenomena is proportional to the magnitude of the electric or magnetic field, or voltage, and current applied to the material. The displacement in the material causes a change in the distance between the fiber optic probe and the reflective surface. The transmitting fiber is coupled to a light source and the receiving fiber or fibers are connected to a light sensing means so that, in operation, the displacement of the material causes the light transmitted through the transmitting fiber to be reflected into the receiving fibers with an intensity that is modulated in a manner proportional to the displacement experienced by the material in response to the electromagnetic phenomenon.

Each of the embodiments described below describes a particular method for measuring the presence and magnitude of electromagnetic phenomena, with embodiments that can be selected whereby voltage, current, or electric or magnetic field is isolated for measurement, although many other variations or modifications can be envisioned whereby a material that experiences a physical displacement due to an electromagnetic phenomena can be measured. Although this invention has been described in relation to the exemplary embodiments thereof, it is well understood by those skilled in the art that other variations and modifications can be affected on the preferred embodiments without departing from the scope and spirit of the invention as set forth herein and within the claims.

1) Fiber Optic Sensor Measuring Lorentz Force Phenomena

In one embodiment, the fiber optic probe measures the displacement in a material that is caused by the electromagnetic phenomena described as the Lorentz Force, the displacement being indicative of the electrical current flowing through the material. Under the Lorentz Force Law, a force is generated upon a charged particle in a direction perpendicular to both the local magnetic field and the direction of the current.

The Lorentz Force equation relates the direction and force applied to a material that is carrying a current. The force experienced is proportional to current and the magnetic field and in a direction perpendicular to the magnetic field and the direction that the electric current is flowing (a concept also explained by the "right hand rule"). The Lorentz Force Law can be expressed as follows:

$$\vec{F} = i_a l \times \vec{B} \qquad \text{Equation 1.}$$

Where:

$\vec{F}$=force
$i_a$=current in the conductor
l=length of the conductor
$\vec{B}$=flux density The current flowing through a conductor, when passed through a magnetic field, creates a force which acts to physically displace the conductor in a direction perpendicular to the direction of the current. In this embodiment, the sensor is constructed to isolate for the measurement of current, the length of the conductor can be set to a predetermined length, and the flux density of the magnetic field can be held constant by the use a local magnet set in a fixed location proximate to the current carrying conductor. As a result, a current carrying conductor is passed through the magnetic field will experience a force perpendicular to the direction of the current, with the force expressed as a linear response to the magnitude of the current, with the force being proportional to current.

The force exerted upon the conductor creates a physical displacement in the material in a direction perpendicular to both the magnetic field and the direction of the current. For example, if the current carrying element is configured as a conductor beam that is supported at both ends, the force exerted upon the beam will be uniform, causing the beam to displace in the following manner:

$$x = \frac{5}{384} \frac{Fl x^3}{EI}.$$ Equation 2

Where:
x=physical displacement of material at center
$5/384$=scalar constant based upon method of material constraint
F=force
l=length of wire
E=modulus of elasticity
I=moment of inertia The scalar constant is a well-known mechanical property that relates the deflection of a material based upon the configuration of the material and the load on that material, and is a property known for many configurations of materials. The length of the conductive beam is readily known, the modulus of the elasticity is readily available information for many materials, and the moment of inertia is a known property of a material with given characteristics. For example, a conductive wire with a circular cross section has a moment of inertia that can be expressed as $\pi d^4/64$. This displacement in the conductor in response the Lorentz Force can be measured by the fiber optic probe. Thus, the Lorentz Force phenomena causes physical displacement of the conductor carrying a current in a given direction. The displacement is measured by the fiber optic probe and such displacement is proportional to current, under the Lorentz Force Law of Equation 1.

FIG. 1 shows an embodiment of an electromagnetic fiber optic sensor 100 featuring a fiber probe and a material that exhibits a physical displacement in response to an electromagnetic phenomena, with the phenomena being explained by the Lorentz Force described in Equation 1.

A fiber bundle 130 featuring a transmitting fiber 110 having a first and second ends is placed adjacent to a reflective surface 140. The first end has a polished finish and the second end is coupled to a light source (not shown). The fiber bundle also features a multitude of receiving fibers 120 disposed around the transmitting fiber with each receiving fiber having first and second ends where the first ends are also polished and the second ends are coupled to a light detecting means (not shown). The fiber bundle is disposed within a tubing 130 such that the first end of the transmitting fiber and the first end of each receiving fiber is adjacent to the reflective side of the material 140 to be measured that exhibits a physical displacement when subjected to a magnetic field, with space between the first fiber end and the reflective side of the material. Here, the material to be measured is a conductor 150 which is itself reflective. However, the material can have an attached reflective body 140 or coating, layer, or other reflective means that is comprised of a reflective material such as a metal (aluminum, beryllium, chromium, copper, gold, molybdenum, nickel, platinum, rhodium, silver, tungsten, and/or an alloy of any of these reflective metals).

In this embodiment, the material that exhibits a physical displacement to the electromagnetic phenomena is a conductor 150 comprised of phosphor bronze. Two magnets 160 are used to create a magnetic field, denoted "B", between the magnets at the area where the fiber probe and the conductive wire are situated adjacent to each other. In this embodiment, a permanent magnet of samarium cobalt (SmCo) is used, although any means may be used to create the magnetic field, including the use of permanent magnets or electromagnets. The conductor is positioned such that a portion of the conductor 150 runs perpendicular to the direction of the magnetic field created by the samarium cobalt magnets.

In operation, a current, denoted "i", is run through the conductor in a given direction. In the presence of a magnetic field caused by the permanent magnets, the introduction of a current in the conductive wire will cause the conductive wire to experience the Lorentz force in a known direction depending upon the direction of the current and the orientation of the magnetic field. Here, as shown in FIG. 1, the force exerted upon the wire results in displacement in the wire towards the direction of the fiber optic probe, the force creating a physical displacement consistent with the displacement equation described in Equation 2. In parallel, light from the light source is launched into the transmitting fiber propagates through the transmitting fiber, emerges at the opposite end, propagates a short distance, and is reflected by the reflective surface of the conductive wire into the receiving fibers, the light then propagates through the receiving fibers, and is detected by light sensing means (not shown).

The displacement in the current carrying conductor due to the Lorentz force in a direction relative to the fiber probe causes a change in the amount of light reflected by the reflective surface of the conductor 140 and into the receiving fibers. The amount of displacement experienced by the conductor is proportional to current flowing through the conductive wire. The increase or decrease in the distance between the optical fiber probe and the reflective surface will cause a change in the amount of reflected light received in the optical fiber. Thus, the intensity of the light coupled into the receiving fibers modulates in relation to the magnitude of the current that is passed through the current carrying conductor. The distance between the end of the optical fiber probe bundle and the reflective surface of the material can be set to a predetermined distance at which the sensitivity of the sensor is high. The optimal distances for obtaining a high level of sensitivity are discussed in detail in later paragraphs.

The type of fiber employed in the embodiment shown in FIG. 1 is generally an optical fiber having a core that is preferably made of glass. The cladding may be plastic or some other material. In a preferred embodiment fibers with a high numerical aperture are used. Generally fibers with a numerical aperture of >0.2 are employed. A high numerical aperture provides for greater efficiency in the coupling and transmission of light. The fiber may be a multimode fiber. Multimode fibers and fibers featuring high numerical apertures are not required, however. When employed in systems that have a great distance between the source and the reflective side of the material a fiber having a high numerical aperture is not critical.

Generally, multimode fibers with a combination of a thick core and thin clad fiber are preferred. Light incident on clad is lost, thus the core needs to be as close in proximity to the outer perimeter of the clad is possible to ensure efficient light coupling in the core. Thus, light coupling within the fiber is maximized with a thick core thin clad structure. This however, does not limit the use of fibers in this device to multimode fibers with thick core thin cladding structures.

Varying degrees of effectiveness and light coupling are possible with other fiber configurations.

In a preferred embodiment, one end of the fiber has a polished finish and the opposite end of the transmitting fiber is coupled to the light source (not shown). The first ends of the receiving fiber or fibers also feature a highly polished finished, with the opposite ends coupled to the light sensing means (not shown). The optical fiber features a 200 µm glass core, and 230 µm plastic clad, a 500 µm Tefzel plastic coating, and a numerical aperture of approximately 0.37. The plastic coating is stripped and epoxy is applied to the fibers so the fibers form a symmetric bundle. The fiber bundle is inserted into a tubing 130 so the fiber bundle is contained within the tube, forming a probe. The fiber probe is positioned such that the first end of the transmitting fiber and the first end of each receiving fiber is adjacent to the reflective surface with space between the first fiber end and the reflective surface. As explained in other paragraphs, a broad dynamic sensitivity maximum has been found for a probe-reflector separation between 180 and 250 µm for this embodiment, but other separations may be preferable based upon the construction of the probe (i.e.—the number of fibers utilized).

The light sensing means is at least one silicon PIN diode. LEDs represent an efficient way to launch light into the fiber probe. LEDs are generally low cost and feature low noise operation in a fiber system. LEDs are also tend to be very stable over extended periods of time. Laser diodes may also be used, although they increase the expense and complexity of the system. Current laser diodes also tend to introduce additional noise to the sensor package. One suitable LED for use as a light source is an Optek OPF370A LED emitting light at 850 µm wavelength.

Figure 2:
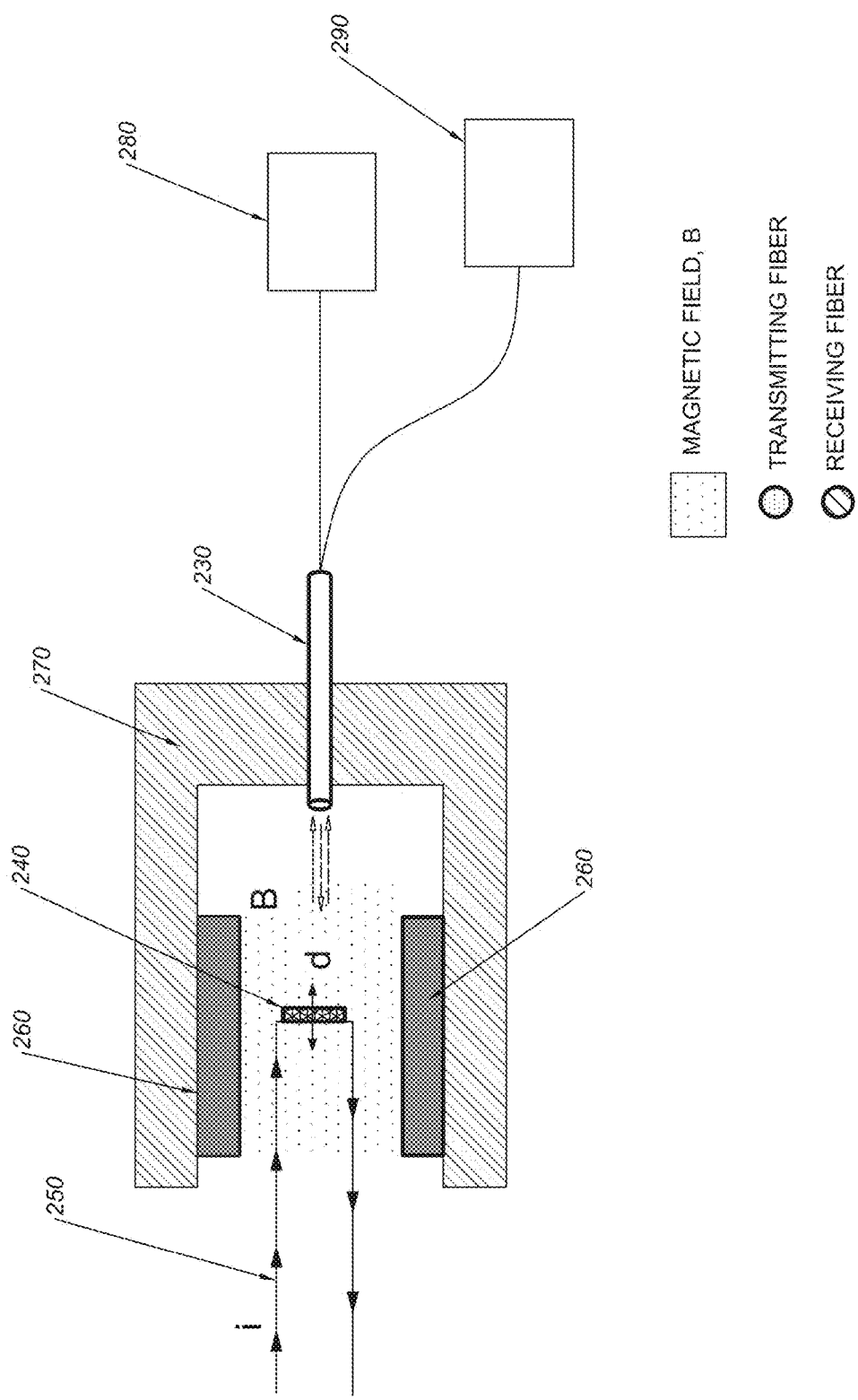
FIG. 2 shows an alternative embodiment of the fiber optic electromagnetic phenomena sensor described in FIG. 1, configured to measure current.

As shown in FIG. 2, described further below, the fiber optic sensor may include a housing. The housing may be constructed such that the housing seals the sensor interior from the external environment in order to exclude dust or other contaminants from the space between the fiber optic probe and the reflective surface of the material to be measured, or where desired depending upon the application, to shield from potential sources of interference or contamination. However, the use of a housing is not required.

In another embodiment a single fiber may be used as both the transmitting and receiving fiber. In this embodiment the light source and the means for sensing the received light are both coupled to the fiber end. The light is launched from the fiber into the reflective surface and is reflected back into the same fiber. In yet another embodiment, the fiber probe may contain a single transmit fiber and a single receive fiber. However, any combination of fibers may be used to form the probe.

FIG. 2 shows an exemplar of a fiber optic electromagnetic phenomena sensor having the structure as described above, but with a protective housing. A fiber bundle 230 featuring a transmitting fiber 210 having a first and second ends is placed adjacent to a reflective surface 240. The first end has a polished finish and the second end is coupled to a light source 280. The fiber bundle also features a multitude of receiving fibers 220 disposed around the transmitting fiber with each receiving fiber having first and second ends where the first ends are also polished and the second ends are coupled to a light detecting means 290. The fiber bundle is inserted into a tubing 230 so the fiber bundle is contained within the tube, forming a probe. The fiber probe 230 is disposed within a housing 270 such that the first end of the transmitting fiber and the first end of each receiving fiber is adjacent to the reflective side 240 of the material 250 to be measured that exhibits a physical displacement when subjected to a magnetic field 250, with space between the first fiber end and the reflective side of the material. The housing can be constructed such that the distance between the fiber probe end and the reflector are set to a fixed distance.

A conductive strip of phosphor bronze 250 is selected to act as the conductor and is disposed within the housing 270 and positioned such that the conductor runs perpendicular to the magnetic field "B" created by the permanent magnets. Here, the material chosen, phosphor bronze, is itself reflective (that is, the conductor and the reflector are part of the same body). However, the material 150 can have an attached reflective body or coating, layer, or other reflective means that is comprised of a reflective material such as a metal (aluminum, beryllium, chromium, copper, gold, molybdenum, nickel, platinum, rhodium, silver, tungsten, and/or an alloy of any of these reflective metals). The conductor is stabilized within the housing such that a length of the conductor is positioned perpendicular to the steady state magnetic field created by the permanent magnets, and at a selected distance from the fiber probe 230.

The sensor uses an LED emitting at 850 nm as the light source 280 with a silicon PIN diode as the light sensing means 290. The fiber bundle 230 disposed within the cartridge housing, comprises six multimode receiving fibers, arranged as described in FIG. 1 above, to form a multi-fiber. A cartridge housing 270 is formed of iron to set the distance between the fiber optic probe 230 and the reflective surface 240 and to protect the sensor device from external contamination and concentrate the magnetic force created by the permanent magnets within the housing. At the area of the housing where the fiber probe and the wire are situated adjacent to each other, two samarium cobalt magnets 260 are used to create a magnetic field within the housing between the magnets. The housing 270 may be constructed such that the housing seals the sensor interior from the external environment in order to exclude dust or other contaminants from the gap between the fiber optic probe and the material to be measured, or where desired depending upon the application, to shield from potential sources of interference or contamination. Here, an iron construction concentrate the magnetic force created by the permanent magnets within the housing and acts to protect sensor from damage and potential contamination.

In operation, a current, denoted "i", is run through the conductor in a given direction. In the presence of a magnetic field "B" caused by the permanent magnets, the introduction of a current in the conductive wire will cause the conductive wire to experience the Lorentz force in a known direction depending upon the direction of the current. Here, as shown in FIG. 2, the force exerted upon the wire results in displacement in the wire towards the direction of the fiber optic probe, the force creating a physical displacement consistent with the displacement equation described in Equation 2. In parallel, light from the light source 280 is launched into the transmitting fiber propagates through the transmitting fiber, emerges at the opposite end of the probe, propagates a short distance, and is reflected by the reflective surface of the conductive wire into the receiving fibers, the light then propagates through the receiving fibers, and is detected by light sensing means 290.

A preferred method of selecting the optical fiber, constructing the fiber optic probe, and a preferred method for determining the optimal distance to position the probe from the material that responds the electromagnetic phenomena is described in detail in the description of FIG. 1. The same method of probe construction and positioning is used in this embodiment. In another embodiment a single fiber may be used as both the transmitting and receiving fiber. In this embodiment the light source and the means for sensing the received light are both coupled to the fiber end. The light is launched from the fiber into the reflective surface and is reflected back into the same fiber. In yet another embodiment, the fiber probe may contain a single transmit fiber and a single receive fiber. However, any combination of fibers may be used to form the probe.

2) Alternative Fiber Optic Sensor Measuring Lorentz Force Phenomena

In an alternative embodiment, the fiber optic electromagnetic phenomena sensor similarly measures the displacement in a material that is produced by the electromagnetic phenomena described as the Lorentz force, the displacement of the material being indicative of the electrical current applied to the material. In this embodiment, however, the electrical current to be measured is split between two conductors which are arranged adjacent and parallel to each other. For this embodiment, the displacement of the material in response to electromagnetic phenomena is based upon the effect explained under Ampere's Law in addition to the Lorentz Force phenomena discussed in Equation 1.

Under Ampere's Law, the magnetic field around a current is proportional to the intensity of the current itself. Ampere's Law can be expressed as follows:

$$B = \frac{\mu}{2\pi} \frac{i_a}{d}. \qquad \text{Equation 3}$$

Where:
B=flux density
µ=permeability
$i_a$=current in the conductor
d=distance between conductors As described under the Lorentz Force equation, Equation 1, the force exerted upon the material by the applied magnetic field is perpendicular to the direction of the current. The flux density in this embodiment is proportional to the current passing through the conductors in an equal manner due to the current source being identical and is therefore held constant as it operates on both conductors with equal force. Combining Ampere's Law and the Lorentz Force Law found in Equation 1, we arrive at the following equation:

$$F = \frac{\mu}{2\pi} \frac{i_a i_b}{d} l. \qquad \text{Equation 4}$$

Where:
F=force
µ=material permeability
$i_a$=current in conductor a
$i_b$=current in conductor b
d=distance between conductors
l=length of conductor From Equation 4 we can see that the amount of force applied to the pair of conductors along their length is proportional to the current flowing through the conductors. Since the distance between the conductors and the length of the conductors are known, and the permeability of the material is a known property of many materials, the current will produce a force between the conductive wires that is proportional to the magnitude of the current and in a direction perpendicular to the direction of the current. Using the principles set forth in Equation 2, the force generated by this electromagnetic phenomena can be expressed as a displacement of the conductors carrying the current in a given direction due to the Lorentz Force.

In this embodiment, two conductors are used, the conductors carrying a common current, and the displacement of the two conductors perpendicular to the direction of the current is proportional to $(\frac{1}{2}i)^2$, where the current is split proportionally between the conductors, or, alternatively, $i_a i_b$ for other embodiments where current is split other than proportionally. Thus, under the same principles set forth in the embodiment discussed in FIG. 1, the force exerted the Lorentz Force is expressed as a displacement of a conductive material carrying a current that can be measured using the fiber optic probe.

Figure 3:
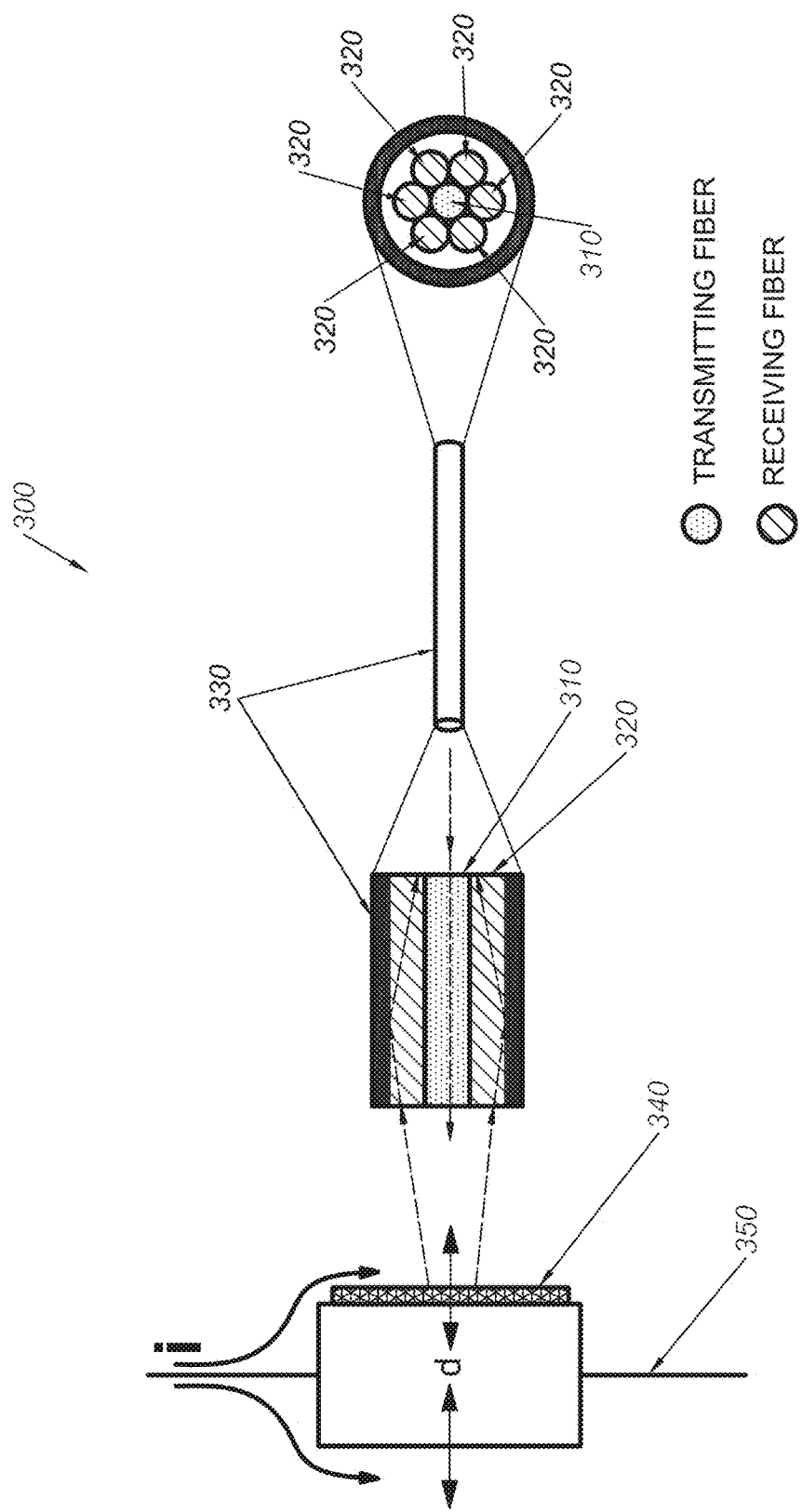
FIG. 3 shows an embodiment of a fiber optic electromagnetic phenomena sensor, configured to measure current.

FIG. 3 shows an embodiment of an electromagnetic fiber optic sensor 300 featuring a fiber probe and a material that exhibits a physical displacement in response to an electromagnetic field, with the displacement caused by Lorentz Force described in Equation 1, which is constructed to measure current and magnetic fields.

A fiber bundle 330 featuring a transmitting fiber 310 having a first and second ends is placed adjacent to a reflective surface 340. The first end has a polished finish and the second end is coupled to a light source (not shown). The sensor uses an LED emitting at 850 µm as the light source with a silicon PIN diode as the light sensing means (not shown). The fiber bundle also features a multitude of receiving fibers 320 disposed around the transmitting fiber with each receiving fiber having first and second ends where the first ends are also polished and the second ends are coupled to the light detecting means. The fiber bundle 330 is constructed and arranged as described in FIG. 1 above, to form a multi-fiber probe. The fiber bundle is inserted into a tubing 330 so the fiber bundle is contained within the tube, forming a probe. The fiber probe is positioned such that the first end of the transmitting fiber and the first end of each receiving fiber is adjacent to the reflective side 340 of the material 350 to be measured that exhibits a physical displacement when subjected to a current, with space between the first fiber end and the reflective side of the material.

The light sensing means is at least one silicon PIN diode. LEDs represent an efficient way to launch light into the fiber probe. LEDs are generally low cost and feature low noise operation in a fiber system. LEDs are also tend to be very stable over extended periods of time. Laser diodes may also be used, although they increase the expense and complexity of the system. Current laser diodes also tend to introduce additional noise to the sensor package. One suitable LED for use as a light source is an Optek OPF370A LED emitting light at 850 µm.

The material 350 that exhibits a physical displacement in response to current is a polished copper conductor, specifically a copper bus bar machined such that a small space is created between two equal sections of bus bar, it will be appreciated however, that any conductor may be used, and that the conductors may be spaced at different distances and at different relative thicknesses depending upon the requirements of a particular application. Here, the material chosen, copper, is itself reflective when polished (that is, the conductor and the reflector are part of the same body). However, the material 350 can have an attached reflective body or coating, layer, or other reflective means 340 that is comprised of a reflective material such as a metal (aluminum, beryllium, chromium, copper, gold, molybdenum, nickel, platinum, rhodium, silver, tungsten, and/or an alloy of any of these reflective metals). The conductor is positioned perpendicular to the magnetic field, and at a selected distance from the fiber probe 330.

In operation, a current, denoted "i", is run through the conductor in a given direction. The introduction of a current in the conductor will cause the conductor to experience the Lorentz force in a direction perpendicular to the direction of the current, displacing the conductive element. Here, as shown in FIG. 3, the force exerted upon the conductor results in displacement in the conductor towards the direction of the fiber optic probe, the force creating a physical displacement consistent with the displacement equation described in Equation 2. In parallel, light from the light source is launched into the transmitting fiber propagates through the transmitting fiber, emerges at the opposite end of the probe, propagates a short distance, and is reflected by the reflective surface of the conductor and into the receiving fibers, the light then propagates through the receiving fibers, and is detected by light sensing means.

A preferred method of selecting the optical fiber, constructing the fiber optic probe, and a preferred method for determining the optimal distance to position the probe from the material that experiences a physical displacement in response to the electromagnetic phenomena is described in detail in the description of FIG. 1 and are similarly employed here. The same method of probe construction and positioning is used in this embodiment. In another embodiment a single fiber may be used as both the transmitting and receiving fiber. In this embodiment the light source and the means for sensing the received light are both coupled to the fiber end. The light is launched from the fiber into the reflective surface and is reflected back into the same fiber. In yet another embodiment, the fiber probe may contain a single transmit fiber and a single receive fiber. However, any combination of fibers may be used to form the probe.

3) Fiber Optic Sensor Measuring Magnetostrictive Effect

In an alternative embodiment, a fiber optic electromagnetic phenomena sensor is constructed to measure the displacement in a material that is produced by the electromagnetic phenomena known as the magnetostrictive effect, the physical displacement of the material being indicative of an applied magnetic field or current. The magnetostricitve effect refers to the phenomena whereby certain materials exhibit physical strain when a magnetic field is applied to the material, causing the material to experience a change in its physical dimensions. The material displaces in the presence of a magnetic field with the displacement experienced being proportional to the strength of the applied magnetic field. See, e.g., Clement and Johnson, Electrical Engineering Science at p. 177 (McGraw-Hill, 1960 ed.) ("Electrical Engineering Science"); Beeby et al., MEMS Mechanical Sensors at p. 109 (2004 ed.). It is well known that a magnetic field can be created by the flow of electrical current in a conductor, as explained by Ampere's Law discussed in Equation 3, and thus in certain configurations, a current can create the magnetic field that causes the magnetostrictive material to experience a physical displacement.

Displacement of the magnetostricitve material is a function of the intensity of the applied magnetic field (or current) and the particular properties of the magnetostricitve material used. The property of the material can be quantified by its magnetostricitve coefficient, which is indicative of the extent to which the material will change in length as the magnetic field applied to that material increases. Magnetostrictive materials include nickel, cobalt, galfenol, terfenol-d, and various alloys although many such materials are known. Each of these materials have known magnetostricitve properties, referred to alternatively as magnetostricitve strain coefficients or strain constants. These coefficients describe the proportional relationship between the magnetic field applied and the mechanical displacements produced in the material.

The relationships between an applied magnetic field and the corresponding displacement in a magnetostricitve element's length are:

$$\Delta l = d_{33} H l \qquad \text{Equation 5.}$$

Where:
  $\Delta l$: change in length of magnetostricitve element
  $d_{33}$: magnetostricitve strain coefficient of material in direction of magnetic poling
    $d_{33}$ is the induced strain in the material in direction 3 per unit of magnetic field applied in direction 3.
  H: magnetic field
  l: length of magnetostricitve element The magnetostricitve strain coefficients of many materials are known properties, whereby the change in material length is proportional to the strength of the magnetic field. Since the magnetostricitve coefficients and geometric dimensions of the selected material are known, and the direction of the magnetic field can be set in a desired orientation, an applied magnetic field or current will produce a displacement in the magnetostrictive material in a linear relationship.

In operation, a magnetic field is introduced to the magnetostrictive element, either by placing the sensor directly into a magnetic field of interest or creating a current in the element through the use of a coiled current-carrying wire. In response to the magnetic field, the magnetostrictive material experiences a physical displacement in a given direction, consistent with the displacement equation described in Equation 5. In parallel, light is launched from the light source into the transmitting fiber, propagates through the transmitting fiber, emerges at the opposite end, propagates a very short distance, and is reflected by the reflective surface of the magnetostrictive material into the receiving fibers, the light then propagates through the receiving fibers, and is detected by light sensing means. The displacement is measured by the fiber probe as the increase or decrease in the distance between the optical fiber and the magnetostricitve material will cause a change in the amount of reflected light received in the optical receiving fibers and sensed by the light sensing means. Thus, the fiber optic probe measures the displacement of the magnetostricitve material, which is proportional to current in the electromagnetic field of interest.

The displacement in the magnetostrictive material in a direction relative to the fiber probe causes a change in the amount of light reflected by the reflective surface of the magnetostrictive material and into the receiving fibers. The amount of displacement experienced by the magnetostrictive material is proportional to current flow. The increase or decrease in the distance between the optical fiber and the reflective surface will cause a change in the amount of reflected light received in the optical fiber and detected by the light detecting means. Thus, the intensity of the light coupled into the receiving fibers modulates in a proportional relationship to the magnetic field that is applied to the magnetostrictive material and is measured by the probe.

Figure 4:
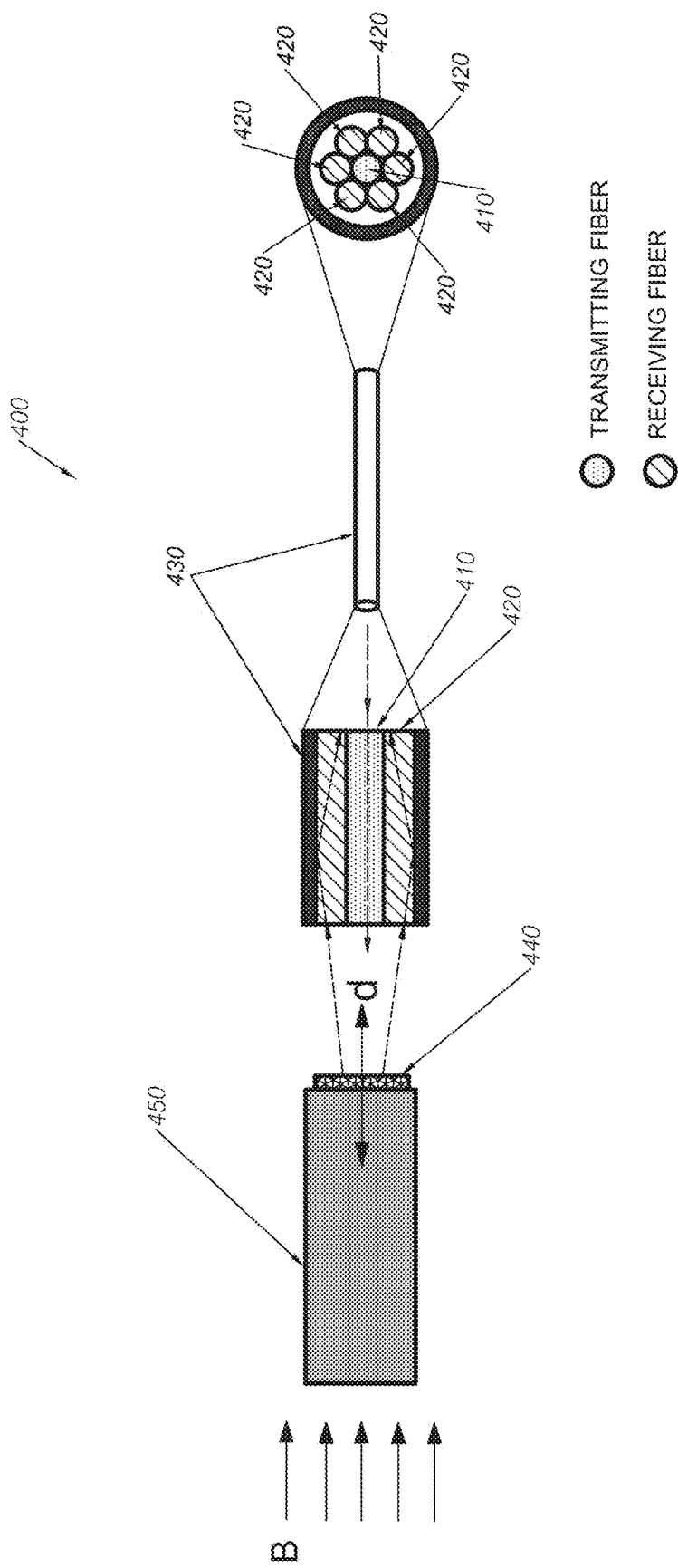
FIG. 4 shows an embodiment of a fiber optic electromagnetic phenomena sensor, configured to measure current.

FIG. 4 shows an embodiment of an electromagnetic fiber optic sensor 400 featuring a fiber probe and a material that exhibits a physical displacement in response to an electromagnetic field, with the displacement caused by magnetostrictive effect described in Equation 5, which measures current and magnetic fields.

A fiber bundle 430 featuring a transmitting fiber 410 having a first and second ends is placed adjacent to a reflective surface 440. The first end has a polished finish and the second end is coupled to a light source (not shown). The sensor uses an LED emitting at 850 nm as the light source with a silicon PIN diode as the light sensing means (not shown). The fiber bundle also features a multitude of receiving fibers 420 disposed around the transmitting fiber with each receiving fiber having first and second ends where the first ends are also polished and the second ends are coupled to the light detecting means. The fiber bundle 430 is constructed and arranged as described in FIG. 1 above, to form a multi-fiber probe. The fiber bundle is inserted into a tubing 430 so the fiber bundle is contained within the tube, forming a probe. The fiber probe is positioned such that the first end of the transmitting fiber and the first end of each receiving fiber is adjacent to the reflective side 440 of the magnetostrictive material 450 to be measured that exhibits a physical displacement when subjected to a magnetic field (which can be created by a current), with space between the first fiber end and the reflective side of the material.

The material 450 that exhibits a physical displacement in response to current is a material that exhibits magnetostrictive properties, such as nickel, cobalt, galfenol, terfenol-d, or a magnetostrictive alloy. Here, nickel is chosen as the magnetostrictive element. The material chosen is polished (that is, the material and the reflector are part of the same body). However, the material 450 can have an attached reflective body or coating, layer, or other reflective means 440 that is comprised of a reflective material such as a metal (aluminum, beryllium, chromium, copper, gold, molybdenum, nickel, platinum, rhodium, silver, tungsten, and/or an alloy of any of these or other reflective metals).

In operation, a magnetic field, denoted "B", is introduced to the magnetostrictive material in a given direction. The introduction of a current in the material will cause the material to exhibit the magnetostrictive effect, whereby the material experiences a physical displacement dependent upon the magnetic poling of the material and the magnetostrictive constant of the material. Here, as shown in FIG. 4, the force exerted upon the material results in displacement in the material towards the direction of the fiber optic probe, the force creating a physical displacement consistent with the displacement equation described in Equation 5. In parallel, light from the light source is launched into the transmitting fiber propagates through the transmitting fiber, emerges at the opposite end of the probe, propagates a short distance, and is reflected by the reflective surface of the material and into the receiving fibers, the light then propagates through the receiving fibers, and is detected by light sensing means. Thus, the intensity of the light coupled into the receiving fibers modulates in a proportional relationship to the current that is passed through the magnetostrictive material and is measured by the sensor. This embodiment allows for direct measurement of a magnetic field of interest in close proximity to a current-carrying conductor of interest, consistent with the principles discussed in Equation 3.

Figure 5:
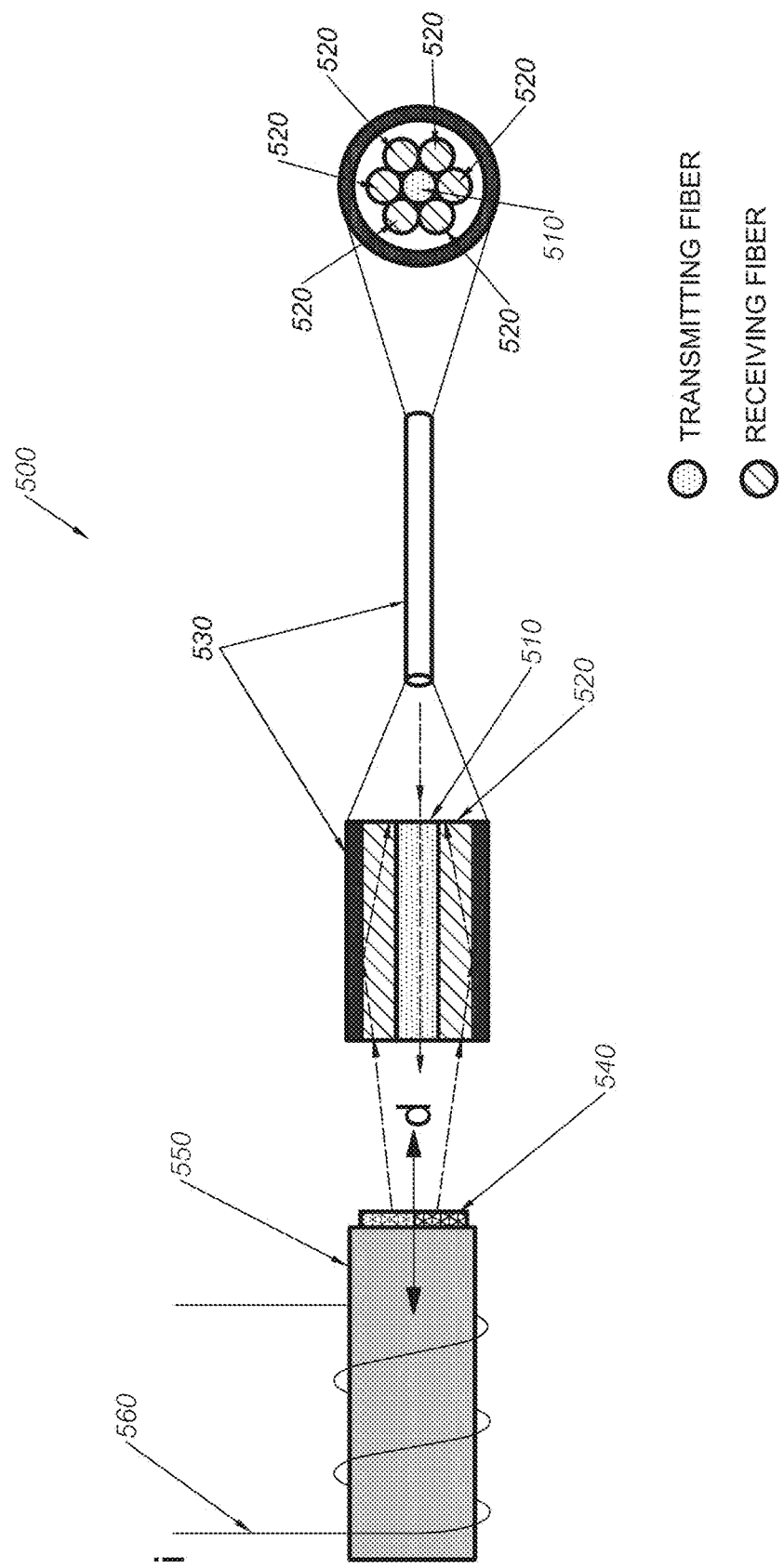
FIG. 5 shows an embodiment of a fiber optic electromagnetic phenomena sensor, configured to measure current.

FIG. 5 shows an exemplar of a fiber optic electromagnetic phenomena sensor having the structure as described in FIG. 4, but where current is induced in the material by the use of a coiled wire 560 carrying a current (denoted "i"). As in FIG. 4, the magnetostrictive element 550 experiences a physical displacement in response to current, the physical displacement changes the distance between the fiber probe 530 and the reflective surface 540 of the material. Like the fiber probe discussed in FIG. 4, the fiber probe consists of a transmit fiber 510 coupled to a light source at one end (not shown) and a multitude of receive fibers coupled to a light detecting means (not shown). The fiber bundle 530 is constructed and arranged as described in FIG. 1 above, to form a multi-fiber probe. The fiber probe is positioned such that the first end of the transmitting fiber and the first end of each receiving fiber is adjacent to the reflective side 540 of the magnetostrictive material 550 to be measured that exhibits a physical displacement when subjected to a current, with space between the first fiber end and the reflective side of the material.

Figure 6:
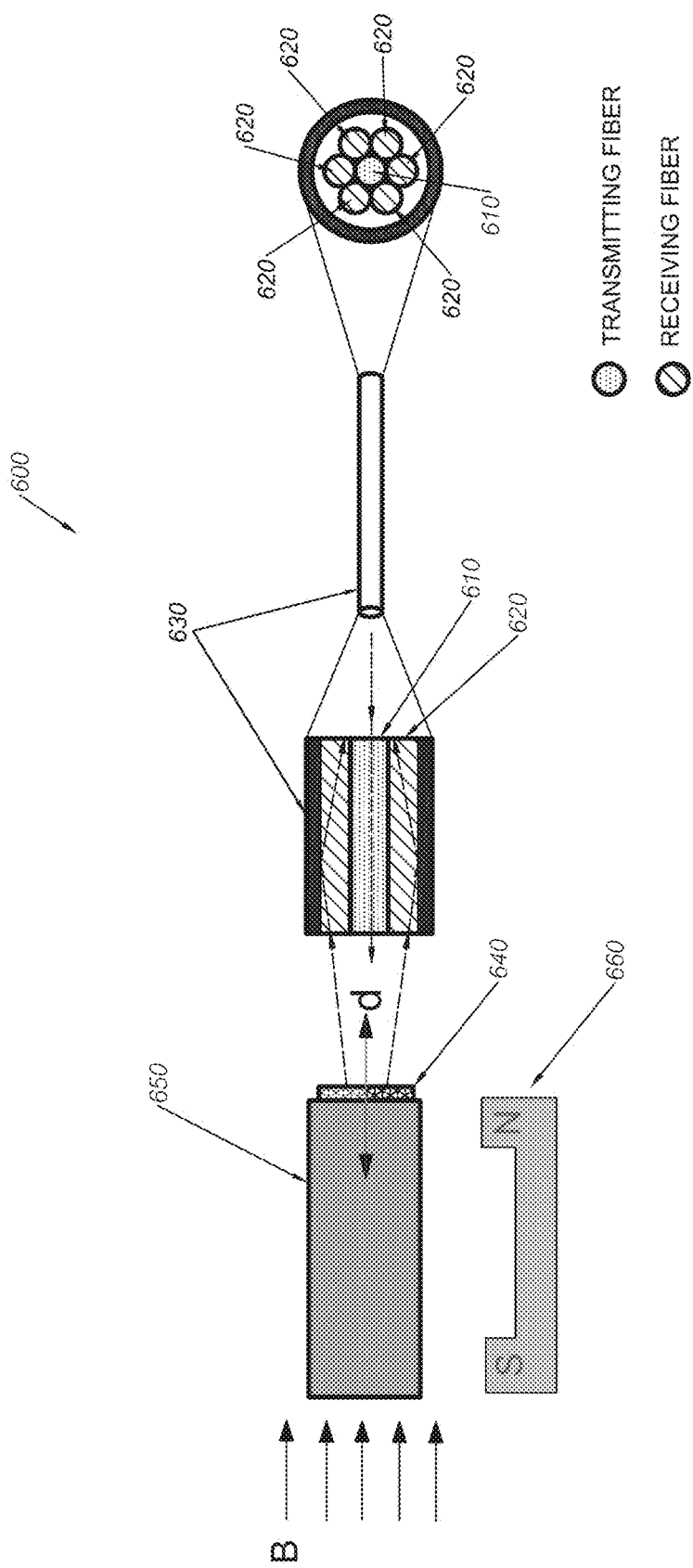
FIG. 6 shows an embodiment of a fiber optic electromagnetic phenomena sensor, configured to measure current.

FIG. 6 shows an alternative fiber optic electromagnetic phenomena sensor having the structure as described in FIG. 4, but with the addition of a permanent magnet 660 (here, samarium cobalt) placed in proximity to the magnetostrictive material. The addition of a local magnetic field creates a shift in the magnetic field around the magnetostrictive material and results in a shift in the output of the measured displacement into a linear range of measurement. SmCo magnets are used in this embodiment, but it will be appreciated that any means can be used to create the desired shift in the magnetic field. As in FIG. 4, the magnetostrictive element 650 experiences a physical displacement in response to current, the physical displacement changes the distance between the fiber probe 630 and the reflective surface 640 of the material. Like the fiber probe discussed in FIG. 4, the fiber probe consists of a transmit fiber 610 coupled to a light source at one end (not shown) and a multitude of receive fibers coupled to a light detecting means (not shown). The fiber bundle 630 is constructed and arranged as described in FIG. 1 above, to form a multi-fiber probe. The fiber probe is positioned such that the first end of the transmitting fiber and the first end of each receiving fiber is adjacent to the reflective side 640 of the magnetostrictive material 650 to be measured that exhibits a physical displacement when subjected to a current, with space between the first fiber end and the reflective side of the material.

Figure 7:
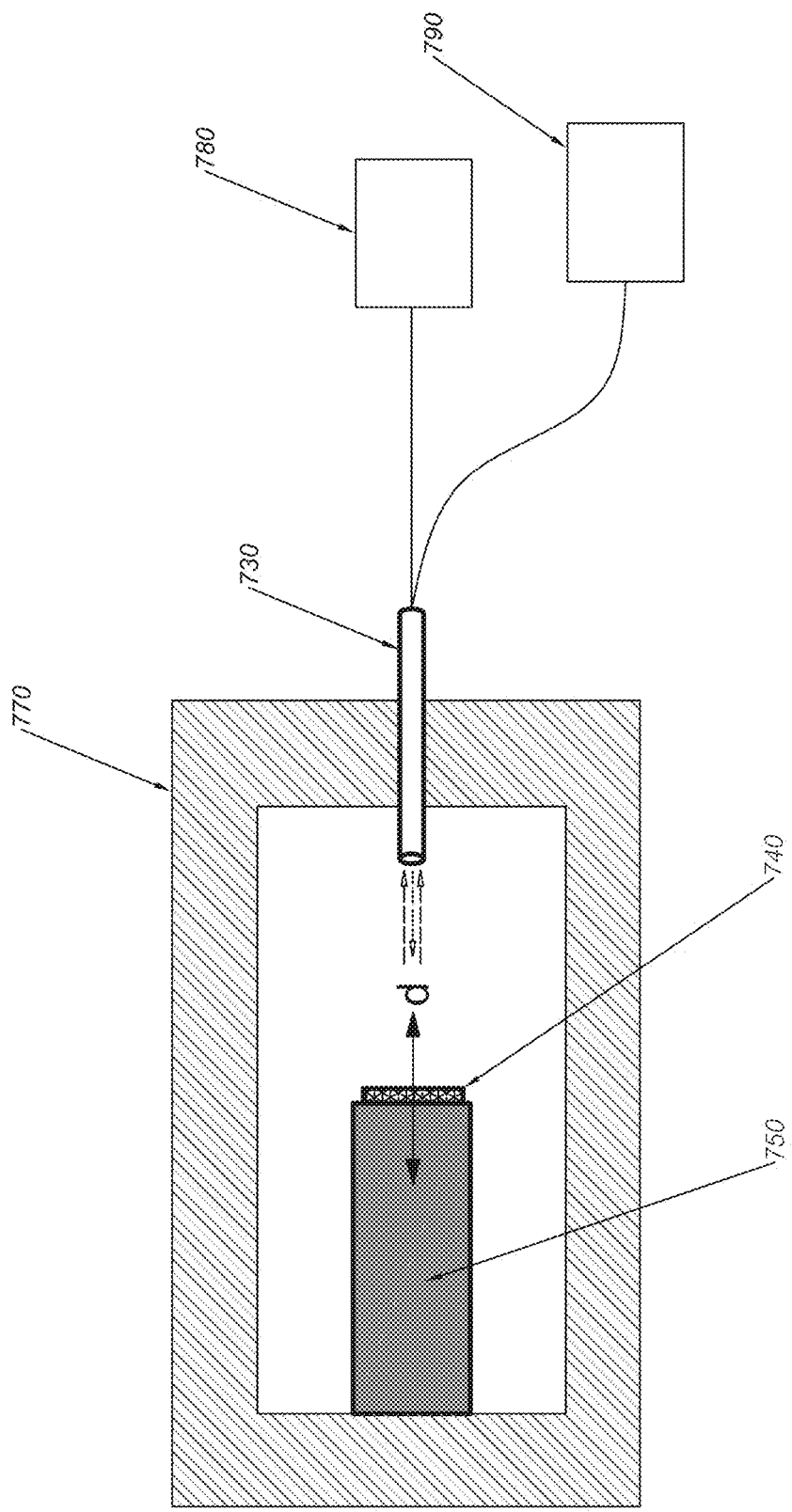
FIG. 7 shows an embodiment of a fiber optic electromagnetic phenomena sensor, configured to measure current.

FIG. 7 shows an exemplar of a fiber optic electromagnetic phenomena sensor having the structure as described in FIG. 4, but where the sensor is enclosed in a protective housing 770 composed of a dielectric material, such as macor ceramic. As in FIG. 4, the magnetostrictive element 750 experiences a physical displacement in response to current, the physical displacement changes the distance between the fiber probe 730 and the reflective surface 740 of the material. Like the fiber probe discussed in FIG. 4, the fiber probe consists of a transmit fiber coupled to a light source 780 at one end and a multitude of receive fibers coupled to a light detecting means 790. The fiber bundle 730 is constructed and arranged as described in FIG. 1 above, to form a multi-fiber probe. The fiber probe is positioned such that the first end of the transmitting fiber and the first end of each receiving fiber is adjacent to the reflective side 740 of the magnetostrictive material 750 to be measured that exhibits a physical displacement when subjected to a current, with space between the first fiber end and the reflective side of the material. The housing can be constructed such that the distance between the fiber probe end and the reflector are set to a fixed distance.

For each of the magnetostrictive sensors described in FIGS. 4, 5, 6, and 7, the light sensing means is at least one silicon PIN diode. LEDs represent a very efficient way to launch light into the fiber probe. LEDs are generally low cost and feature low noise operation in a fiber system. LEDs are also tend to be very stable over extended periods of time. Laser diodes may also be used, although they increase the expense and complexity of the system. Current laser diodes also tend to introduce additional noise to the sensor package.

One suitable LED for use as a light source is an Optek OPF370A LED emitting light at 850 μm.

For each of the magnetostrictive sensors described in FIGS. 4, 5, 6, and 7, the force exerted upon the magnetostrictive material due to the magnetostrictive effect in the presence of a magnetic field (caused by a current) results in physical displacement in the material towards the direction of the fiber optic probe, the force creating a physical displacement consistent with the equation described in Equation 5. In parallel, light from the light source is launched into the transmitting fiber propagates through the transmitting fiber, emerges at the opposite end of the probe, propagates a short distance, and is reflected by the reflective surface of the material and into the receiving fibers, the light then propagates through the receiving fibers, and is detected by light sensing means. Thus, the intensity of the light coupled into the receiving fibers modulates in a proportional relationship to the magnetic field that is applied to the magnetostrictive material and is measured by the sensor.

A preferred method of selecting the optical fiber, constructing the fiber optic probe, and a preferred method for determining the optimal distance to position the probe from the material that experiences a physical displacement in response to the electromagnetic phenomena is described in detail in the description of FIG. 1 and are similarly employed here. The same method of probe construction and positioning is used in this embodiment. In another embodiment a single fiber may be used as both the transmitting and receiving fiber. In this embodiment the light source and the means for sensing the received light are both coupled to the fiber end. The light is launched from the fiber into the reflective surface and is reflected back into the same fiber. In yet another embodiment, the fiber probe may contain a single transmit fiber and a single receive fiber. However, any combination of fibers may be used to form the probe.

4) Fiber Optic Sensor Measuring Piezoelectric Effect

In an alternative embodiment, the fiber optic electromagnetic phenomena sensor measures the displacement in a material that is produced by the electromagnetic phenomena known as the piezoelectric effect, the displacement of the material being indicative of voltage. The piezoelectric effect, or piezoelectricity, refers to the ability of materials to convert mechanical energy into electrical energy and vice versa. The direct piezoelectric effect described the phenomena whereby piezoelectric materials, when subjected to mechanical stress, generate an electric charge proportional to that stress. Under the inverse piezoelectric effect, the same materials become physically strained when an electric field is applied, exhibiting a displacement of the material, with the displacement being proportional to the strength of the applied electric field. See, e.g., Electrical Engineering Science at pg. 177. Thus, the amount of displacement experienced by the piezoelectric material is proportional to the potential difference between the face of the material, indicating the electric voltage present.

Displacement of piezoelectric material is a function of the applied electric field strength and the properties of the piezoelectric material used. The material properties are described as piezoelectric strain coefficients. Common piezoelectric materials are zinc oxide, aluminum nitride, lead zirconate titanate (PZT), lead magnesium niobate-lead titanate, gallium phosphate, quartz, tourmaline, and polyvinylidene fluoride (PVDF), each of which has a known piezoelectric strain coefficient, although many such materials are known. These coefficients describe the proportional relationship between the applied electrical field and the mechanical displacements produced.

The relationships between an applied voltage or electric field and the corresponding displacement in a piezoelectric material element's thickness, length, or width are:

$$\Delta h = d_{33} V$$

$$S = d_{33} E$$

$$\Delta l/l = d_{31} E$$

$$\Delta w/w = d_{31} E \qquad \text{Equation 6.}$$

Where:
l: initial length of piezoelectric element
w: initial width of piezoelectric element
$\Delta h$: change in height (thickness) of piezoelectric element
$\Delta l$: change in length of piezoelectric element
$\Delta w$: change in width of piezoelectric element
d: piezoelectric coefficient of material in a given poling direction
  $d_{33}$ is the induced strain in the material in direction 3 per unit of electric field applied in direction 3.
  $d_{31}$ is the induced strain in the material in direction 1 per unit of electric field applied in direction 3.
V: applied voltage
S: strain (change in h/initial h of element)
E: electric field To identify directions in a piezoelectric element, three axes are used. These axes, termed 1, 2, and 3, are analogous to X, Y, and Z of the classical three dimensional set of axes. The polar, or 3 axis, is parallel to the direction of polarization within the material. However, the geometry of the piezoelectric material can be a rectangular prism, a bar, a strip, or any other shape. Moreover, the piezoelectric strain constants of many materials are known properties that exhibit a linear relationship between the electric and mechanical state. Since the geometric dimensions, piezoelectric constants, and polarization directions of the material selected are known, and the direction of the electric field direction can be set in a desired orientation, the application of an electric field to the material will produce a displacement in the material in known direction and in proportion to the strength of the electric field.

In operation, the piezoelectric element is connected to a voltage source. The material experiences a physical displacement in response to the applied voltage, consistent with the displacement equation described in Equation 6. In parallel, light is launched from the light source into the transmitting fiber propagates through the transmitting fiber, emerges at the end of the fiber, propagates a very short distance, and is reflected by the reflective surface of the piezoelectric material into the receiving fibers, the light then propagates through the receiving fibers, and is detected by light sensing means. The displacement is measured by the fiber probe as the increase or decrease in the distance between the optical fiber and the piezoelectric material will cause a change in the amount of reflected light received in the optical receiving fibers and sensed by the light sensing means. Thus, the fiber optic probe measures the displacement of the piezoelectric material, which is proportional to voltage in the circuit of interest.

The displacement in the piezoelectric material in a direction relative to the fiber probe causes a change in the amount of light reflected by the reflective surface of the piezoelectric material and into the receiving fibers. The amount of displacement experienced by the piezoelectric material is proportional to the voltage flowing through the material. The increase or decrease in the distance between the optical fiber and the reflective surface will cause a change in the amount of reflected light received in the optical fiber and detected by the light detecting means. Thus, the intensity of the light coupled into the receiving fibers modulates in a proportional relationship to the voltage applied to the piezoelectric material and is measured by the probe.

Figure 8:
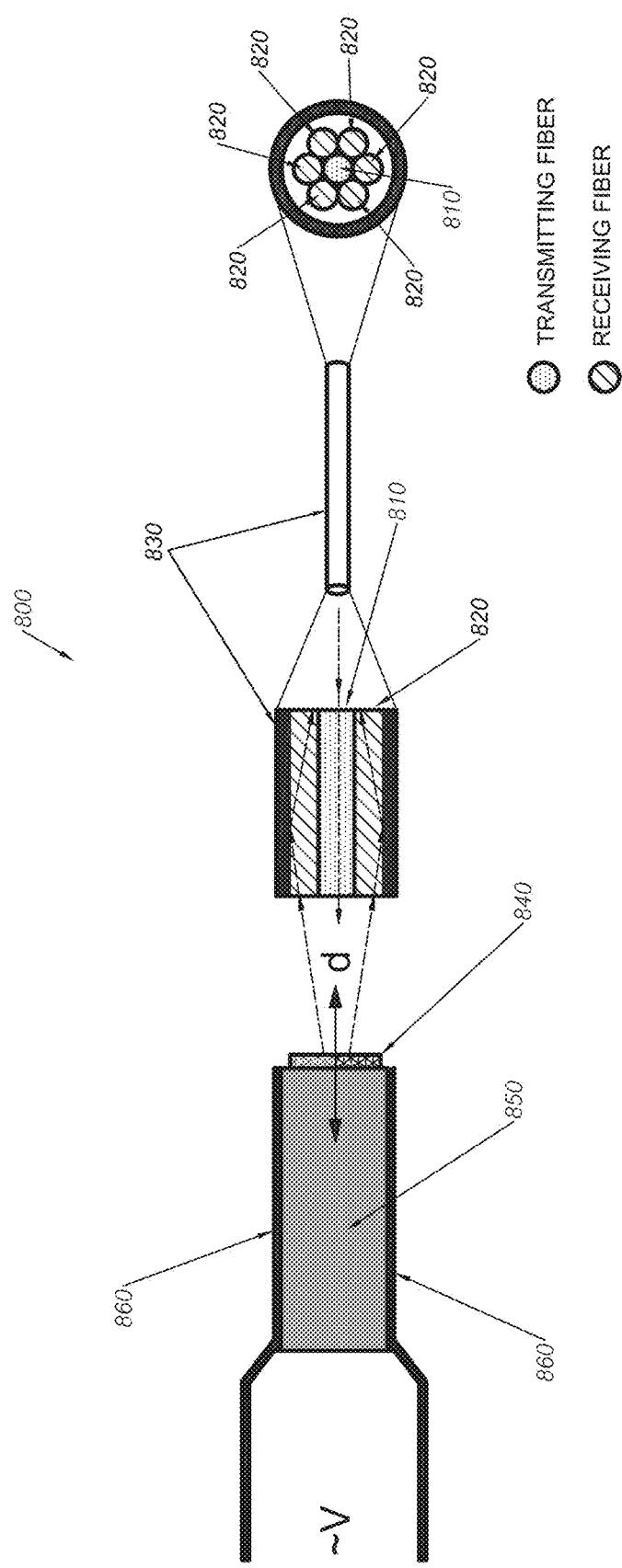
FIG. 8 shows an embodiment of a fiber optic electromagnetic phenomena sensor, configured to measure voltage.

FIG. 8 shows an embodiment of an electromagnetic fiber optic sensor 800 featuring a fiber probe and a material that exhibits a physical displacement in response to an electromagnetic field, with the displacement caused by piezoelectric effect described in Equation 6, which measures voltage and electric fields.

A fiber bundle 830 featuring a transmitting fiber 810 having a first and second ends is placed adjacent to a reflective surface 840. The first end has a polished finish and the second end is coupled to a light source (not shown). The sensor uses an LED emitting at 850 nm as the light source with a silicon PIN diode as the light sensing means (not shown). The fiber bundle also features a multitude of receiving fibers 820 disposed around the transmitting fiber with each receiving fiber having first and second ends where the first ends are also polished and the second ends are coupled to the light detecting means. The fiber bundle 830 is constructed and arranged as described in FIG. 1 above, to form a multi-fiber probe. The fiber bundle is inserted into a tubing 830 so the fiber bundle is contained within the tube, forming a probe. The fiber probe is positioned such that the first end of the transmitting fiber and the first end of each receiving fiber is adjacent to the reflective side 840 of the piezoelectric material 850 to be measured that exhibits a physical displacement when subjected to a current, with space between the first fiber end and the reflective side of the material.

The material 850 that exhibits a physical displacement in response to current is a material that exhibits the piezoelectric effect when an electric field or voltage is applied to the material. Common piezoelectric materials are zinc oxide, aluminum nitride, lead zirconate titanate (PZT), lead magnesium niobate-lead titanate, gallium phosphate, quartz, tourmaline, and polyvinylidene fluoride (PVDF), each of which has a known piezoelectric strain coefficient, although many such materials are known. In this embodiment, a rectangular prism of PZT material is selected. The material chosen is polished (that is, the material and the reflector are part of the same body). However, the material 850 can also have an attached reflective body or coating, layer, or other reflective means 840 that is comprised of a reflective material such as a metal (aluminum, beryllium, chromium, copper, gold, molybdenum, nickel, platinum, rhodium, silver, tungsten, and/or an alloy of any of these or other reflective metals).

In operation, an electric field or voltage (denoted "V") is introduced to the piezoelectric material in a given direction by attaching electrodes 860 to the material 850 in a desired orientation. The introduction of a voltage in the material will cause the material to display the piezoelectric effect, whereby the material experiences a physical displacement dependent upon the poling of the material and the piezoelectric constant of the material. Here, as shown in FIG. 8, the force exerted upon the material results in displacement in the material in a known direction, the force creating a physical displacement consistent with the displacement equation described in Equation 6, and the sensor can be constructed such that the displacement is towards the direction of the fiber optic probe. In parallel, light from the light source is launched into the transmitting fiber propagates through the transmitting fiber, emerges at the opposite end of the probe, propagates a short distance, and is reflected by the reflective surface of the material and into the receiving fibers, the light then propagates through the receiving fibers, and is detected by light sensing means. Thus, the intensity of the light coupled into the receiving fibers modulates in a proportional relationship to the voltage across the piezoelectric material.

Figure 9:
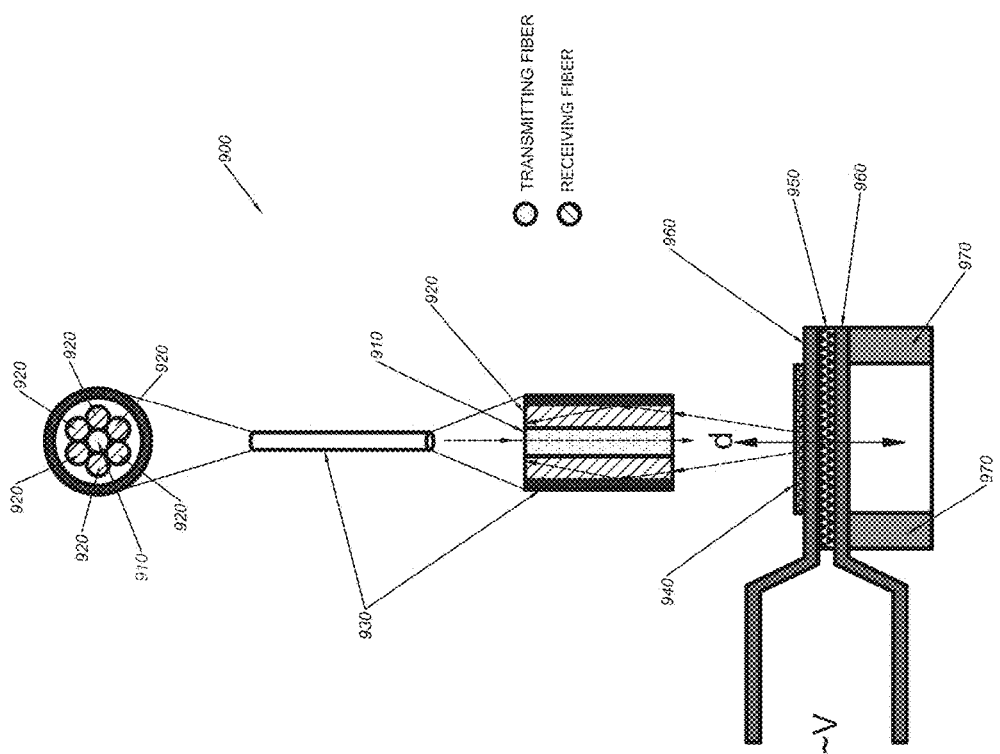
FIG. 9 shows an embodiment of a fiber optic electromagnetic phenomena sensor, configured to measure voltage.

FIG. 9 shows an exemplar of a fiber optic electromagnetic phenomena sensor having the structure as described in FIG. 8, but where the piezoelectric material 950 chosen is a thin strip of PVDF material. As in FIG. 8, the piezoelectric element 950 experiences a physical displacement in response to the introduction of an electric field (or voltage denoted "V") to the element through two electrodes 960 attached to the material. In response to the voltage applied, the piezoelectric material experiences a physical displacement. The physical displacement changes the distance between the fiber probe 930 and the reflective surface 940 of the piezoelectric material. Support elements 970 constructed of a dielectric material, such as macor ceramic are employed to stabilize the piezoelectric material. Like the fiber probe discussed in FIG. 8, the fiber probe consists of a transmit fiber 910 coupled to a light source at one end (not shown) and a multitude of receive fibers coupled to a light detecting means (not shown). The fiber bundle 930 is constructed and arranged as described in FIG. 1 above, to form a multi-fiber probe. The fiber probe is positioned such that the first end of the transmitting fiber and the first end of each receiving fiber is adjacent to the reflective side 940 of the piezoelectric material 950 to be measured that exhibits a physical displacement when subjected to a voltage, with space between the first fiber end and the reflective side of the material.

Figure 10:
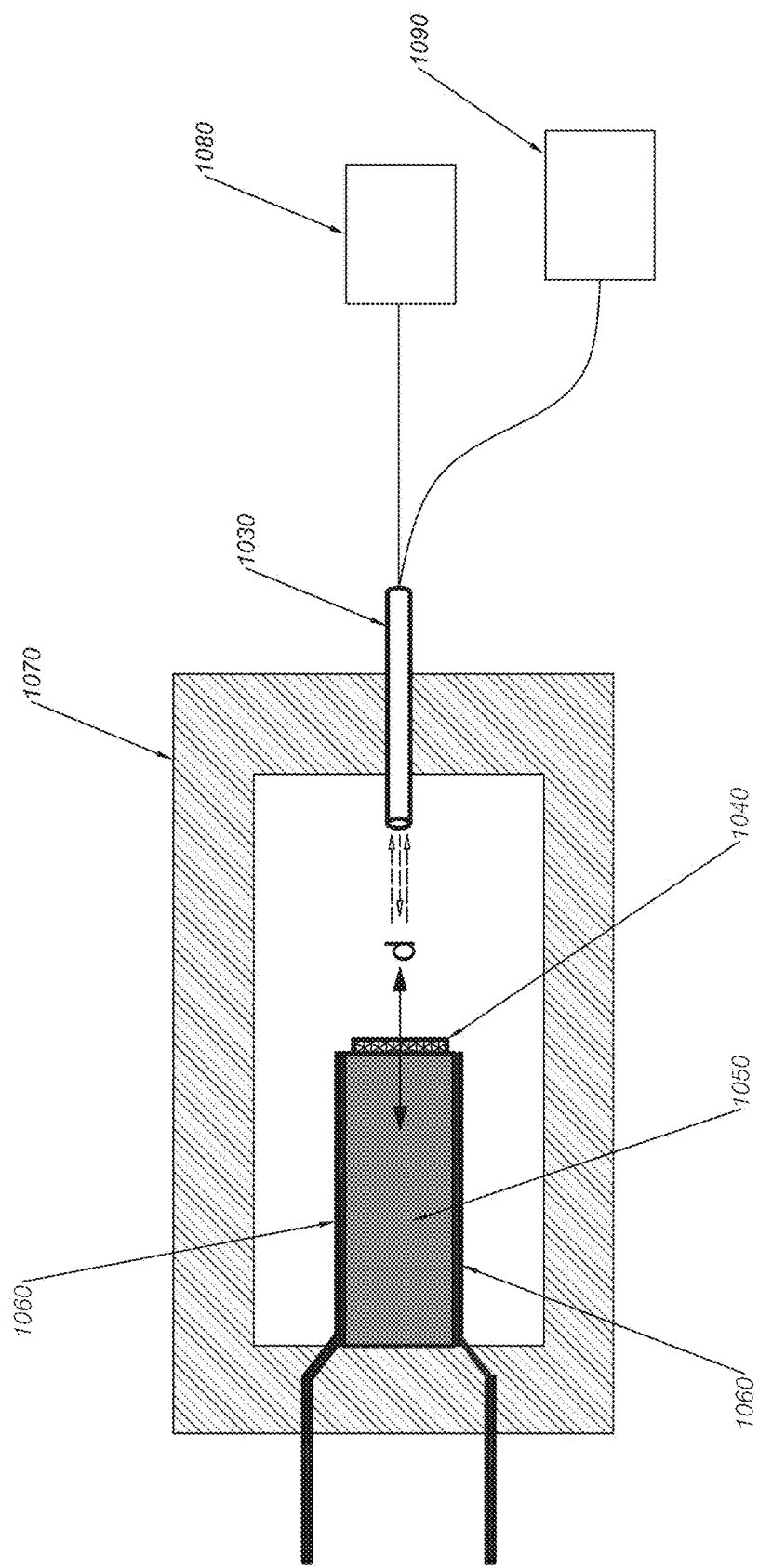
FIG. 10 shows an embodiment of a fiber optic electromagnetic phenomena sensor, configured to measure voltage.

FIG. 10 shows an exemplar of a fiber optic electromagnetic phenomena sensor having the structure as described in FIG. 8, but where the sensor is enclosed in a protective housing 1070 composed of a dielectric material, such as macor ceramic, but other construction elements may be employed. As in FIG. 8, the piezoelectric element 1050 experiences a physical displacement in response to an applied electric field (or voltage), the physical displacement changes the distance between the fiber probe 1030 and the reflective surface 1040 of the material. Like the fiber probe discussed in FIG. 8, the fiber probe consists of a transmit fiber coupled to a light source 1080 at one end and a multitude of receive fibers coupled to a light sensing means 1090. The fiber bundle 1030 is constructed and arranged as described in FIG. 1 above, to form a multi-fiber probe. The fiber probe is positioned such that the first end of the transmitting fiber and the first end of each receiving fiber is adjacent to the reflective side 1040 of the piezoelectric material 1050 to be measured that exhibits a physical displacement when subjected to a voltage, with space between the first fiber end and the reflective side of the material.

For each of the piezoelectric sensors described in FIGS. 8, 9 and 10, the light sensing means is at least one silicon PIN diode. LEDs represent a very efficient way to launch light into the fiber probe. LEDs are generally low cost and feature low noise operation in a fiber system. LEDs are also tend to be very stable over extended periods of time. Laser diodes may also be used, although they increase the expense and complexity of the system. Current laser diodes also tend to introduce additional noise to the sensor package. One suitable LED for use as a light source is an Optek OPF370A LED emitting light at 850 μm.

For each of the piezoelectric sensors described in FIGS. 8, 9 and 10, the force exerted upon the piezoelectric material due to the piezoelectric effect in the presence of an electric field or voltage results in physical displacement in the material towards the direction of the fiber optic probe, the force creating a physical displacement consistent with Equation 5. In parallel, light from the light source is launched into the transmitting fiber propagates through the transmitting fiber, emerges at the opposite end of the probe, propagates a short distance, and is reflected by the reflective surface of the material and into the receiving fibers, the light then propagates through the receiving fibers, and is detected by light sensing means. Thus, the intensity of the light coupled into the receiving fibers modulates in a proportional relationship to the voltage or electric field that is applied to the piezoelectric material and is measured by the sensor.

A preferred method of selecting the optical fiber, constructing the fiber optic probe, and a preferred method for determining the optimal distance to position the probe from the material that experiences a physical displacement in response to the electromagnetic phenomena is described in detail in the description of FIG. 1 and are similarly employed here. The same method of probe construction and positioning is used in this embodiment. In another embodiment a single fiber may be used as both the transmitting and receiving fiber. In this embodiment the light source and the means for sensing the received light are both coupled to the fiber end. The light is launched from the fiber into the reflective surface and is reflected back into the same fiber. In yet another embodiment, the fiber probe may contain a single transmit fiber and a single receive fiber. However, any combination of fibers may be used to form the probe.

5) Sensor Employing Amplification of Piezoelectric and Magnetostrictve Effect

The displacement of either the electromagnetic phenomena sensors measuring magnetostrictive or piezoelectric effects described in FIGS. 4 to 10 can be amplified in order to detect smaller displacements in the underlying material by structuring the reflective body that is attached to the material such that the reflective body displaces in a manner proportional to, but greater than, the underlying displacement in the magnetostrictive or piezoelectric material.

Figure 11:
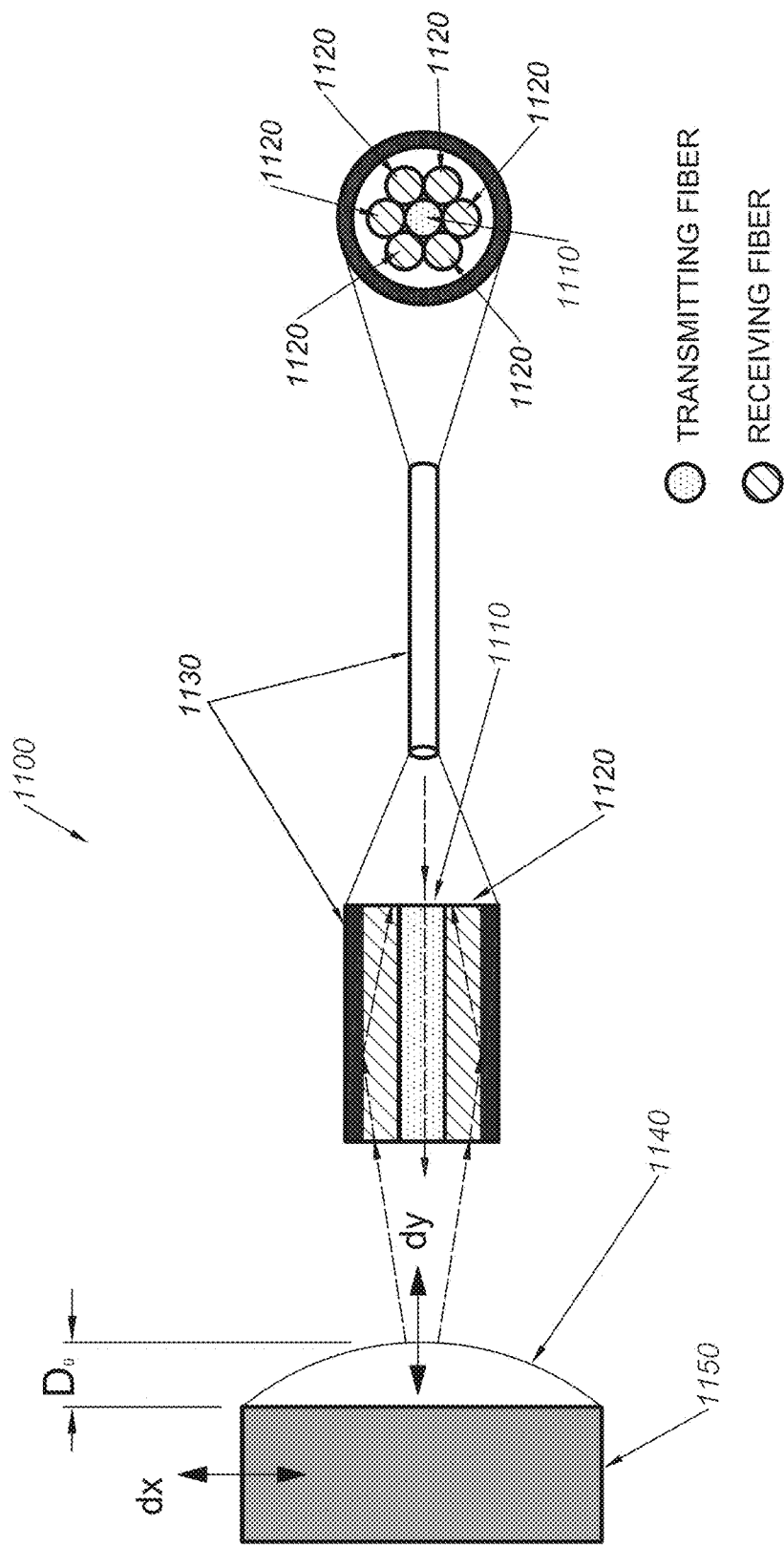
FIG. 11 shows an alternative embodiment of a fiber optic electromagnetic field sensor, where the reflective material is configured to amplify the displacement experienced by the material exhibiting a physical displacement in response to an electromagnetic phenomena.

FIG. 11 shows an embodiment of the magnetostrictive or piezoelectric sensor with a mechanical amplification element 1100. In order to amplify the displacement measured by the probe, a reflective material 1140 be can affixed to the piezoelectric or magnetostrictive material 1150, along the material's length dimension "x". The reflective material 1140 of each sensor has a length longer than "x" and is pre-bent such that it forms an arc of an ellipse. The arc is then affixed to the ends of the length dimension of the piezoelectric or magnetostrictive material 1150. When affixed in such a manner, the height of the reflective arc can be changed by manipulating the axis of the ellipse along its length dimension (denoted "dx"), with the displacement of the arc being expressed in direction (denoted "dy") perpendicular to the original displacement of the element. The resulting displacement of the element 1140 along direction "y" (denoted "$D_o$") will be an amplification of the displacement along the length direction. The displacement experienced by the reflective arc can be found with reference to the length of the circumference of the ellipse that is formed, and can be found by the following equation:

$$l = 4aE(e) \quad \text{Equation 7.}$$

Where:
l=length of circumference of ellipse
a=length of major axis of ellipse
E=elliptical integral of the second kind
e=eccentricity of the ellipse The eccentricity of the ellipse can be found with the following equation:

$$e = \frac{\sqrt{a^2 - b^2}}{a^2}$$

Where:
a=length of major axis of ellipse
b=length of minor axis of ellipse

Thus, in operation, the physical force exerted upon the arc of reflective material as a result of the displacement in the piezoelectric or magnetostrictive material is expressed as a physical displacement in a direction perpendicular to the underlying displacement. While the length of the arc remains constant, the center of the arc will displace along the minor axis in a manner proportional to the change in the major axis, in order to maintain a constant circumference. Thus, in response to the change in the length of the piezoelectric or magnetostrictive material, the change in length of the major axis of the ellipse results in a displacement in a direction perpendicular to the change in length with an amplification of the underlying material's displacement. In this manner, the change in the height of the arc is an amplification of the change in the length of the major axis of the ellipse, consistent with the elliptical function described in Equation 7. The physical displacement of the reflective arc 1140 is measured by the probe 1130 and the displacement is proportional to the underlying displacement in the piezoelectric or magnetostrictive material.

In parallel, light is launched from a light source (not shown) into the transmitting fiber 1110 propagates through the transmitting fiber, emerges at the opposite end, propagates a short distance, and is reflected by the reflective arc 1140, and into the receiving fibers 1120, the light then propagates through the receiving fibers, and is detected by light sensing means (not shown). The displacement is measured by the fiber probe as the increase or decrease in the distance between the optical fiber and the piezoelectric material will cause a change in the amount of reflected light received in the optical receiving fibers and sensed by the light sensing means. Thus, the fiber optic probe measures the amplified displacement of the piezoelectric or magnetostrictive material, which is proportional to the underlying displacement created by the piezoelectric or magnetostrictive effect. Thus, the intensity of the light reflected into the receiving fibers modulates in a proportional relationship to the displacement of the piezoelectric material and is measured by the sensor.

A preferred method of selecting the optical fiber, constructing the fiber optic probe, and a preferred method for determining the optimal distance to position the probe from the reflective arc that is attached to a material that experiences a physical displacement in response to the electromagnetic phenomena is described in detail in the description of FIG. 1 and are similarly employed here. The same method of probe construction and positioning is used in this embodiment. In another embodiment a single fiber may be used as both the transmitting and receiving fiber. In this embodiment the light source and the means for sensing the received light are both coupled to the fiber end. The light is launched from the fiber into the reflective surface and is reflected back into the same fiber. In yet another embodiment, the fiber probe may contain a single transmit fiber and a single receive fiber. However, any combination of fibers may be used to form the probe.

6) Fiber Optic Sensor Measuring Force Explained by Coulomb's Law Phenomena

In an alternative embodiment, the fiber optic electromagnetic phenomena sensor measures the displacement in a material that is created by the force explained by Coulomb's Law, allowing for measurement of electric fields or voltage. Under Coulomb's Law, the force produced by two charged object is proportional to product of the quantity of charges upon the objects and the distance between the objects. Coulomb's Law can be expressed as follows:

$$F = q_1 q_2 / 4\pi \in_0 \in_r d \qquad \text{Equation 8.}$$

Where:
F=force
$q_1$=electric charge 1
$q_2$=electric charge 2
$4\mu\in_o$=Coulomb's constant
$\in_o$=vacuum permittivity of free space
$\in_r$=relative permittivity of medium
d=distance between the charges Alternatively, in an embodiment where a voltage source is applied to a pair of conductors where the conductors have opposite charges:

$$F = q / 4\pi \in_o \in_r d \qquad \text{Equation 9.}$$

Where:
F=Force
q=electric charge
$4\mu\in_o$=Coulomb's constant
$\in_o$=vacuum permittivity of free space
$\in_r$=relative permittivity of medium
d=distance between the charges In this embodiment the sensor is constructed such that the distance between the charges is initially fixed. The Coulomb's constant in the equation is a known quantity. The vacuum permittivity of the free space between the charges is also known, as is the relative permittivity of the medium, which is a known property of many gases (such as air, nitrogen, and $SF_6$), liquids, and solids. Given these known quantities, from Equation 8 and 9 we can see that the amount of force applied to a pair of conductors, such as a capacitor, along its surface is proportional to the voltage in an electric field of interest. Thus, the distribution of the charge upon a plate creates a force that is proportional to the strength of the electric field between the two plates. Or, expressed another way, force is proportional to $(q_1 \times q_2 \times s)/d$ where "s" is equal to the square area of the conductors.

In this embodiment, the application of a voltage to a pair of conductors generates a force, the force is expressed as a physical displacement of the conductive material carrying the voltage. Here, two conductors are used, carrying a voltage with a given potential, and the displacement of the conductors is proportional to the voltage squared. In an alternative embodiment, where a pair of conductors are used where the conductors carry opposite charges, the conductors exhibit a displacement force that is both linear and proportional to the applied voltage. Thus, under the same basic principles set forth in the embodiment discussed in the alternative embodiments, the force exerted by an electric field is expressed as a displacement of a conductive material in a given direction. The displacement is measured by the probe and such displacement is proportional to voltage, consistent with the Coulomb's Law described in Equation 8 and 9 above.

Figure 12:
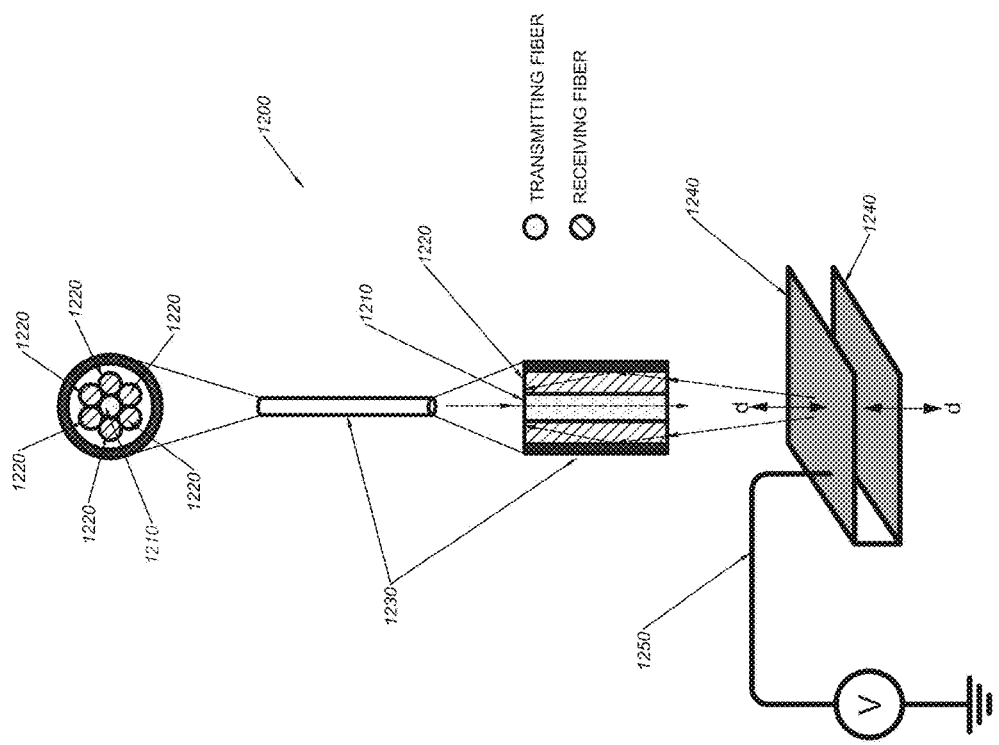
FIG. 12 shows an embodiment of a fiber optic electromagnetic phenomena sensor, configured to measure voltage.

FIG. 12 shows an embodiment of an electromagnetic fiber optic sensor 1200 featuring a fiber probe 1230 and a material that exhibits a physical displacement in response to an electromagnetic field, with the displacement caused by force explained by Coulomb's Law.

A fiber bundle 1230 featuring a transmitting fiber 1210 having a first and second ends is placed adjacent to a reflective surface 1240. The first end has a polished finish and the second end is coupled to a light source (not shown). The sensor uses an LED emitting at 850 nm as the light source with a silicon PIN diode as the light sensing means (not shown). The fiber bundle also features a multitude of receiving fibers 1220 disposed around the transmitting fiber with each receiving fiber having first and second ends where the first ends are also polished and the second ends are coupled to the light detecting means. The fiber bundle 1230 is constructed and arranged as described in FIG. 1 above, to form a multi-fiber probe. The fiber bundle is inserted into a tubing 1230 so the fiber bundle is contained within the tube, forming a probe. The fiber probe is positioned such that the first end of the transmitting fiber and the first end of each receiving fiber is adjacent to the reflective side 1240 of the conductor 1250 to be measured that exhibits a physical displacement of the conductor when a voltage is applied, with space between the first fiber end and the reflective side of the material.

The material 1240 that exhibits a physical displacement in response to an introduced electric field (or voltage) is a conductor. In this embodiment, two sheets of copper foil are selected, pre-cut to two 1 inch square pieces, with a non-conductive element, such as air, between the two copper sheets. The copper is polished (that is, the material and the reflector are part of the same body) on the surface of the conductor adjacent to the fiber optic probe. However, the conductor 1240 can also have an attached reflective body or coating, layer, or other reflective means (not shown) that is comprised of a reflective material such as a metal (aluminum, beryllium, chromium, copper, gold, molybdenum, nickel, platinum, rhodium, silver, tungsten, and/or an alloy of any of these or other reflective metals). The copper foil plates are then spaced at a set distance, parallel to one another.

In operation, an electric field, or voltage denoted "V", is introduced to the conductive plates 1240 from a voltage source 1250. The introduction of a voltage in the material will cause the material to experience the force explained by Coulomb's Law and, as a result, the force creating a physical displacement in the conductors proportional of the strength of the electric field between the two conductors, consistent with the Coulomb's Law equations described above. In parallel, light from the light source is launched into the transmitting fiber propagates through the transmitting fiber, emerges at the opposite end of the probe, propagates a short distance, and is reflected by the reflective surface of the conductor and into the receiving fibers, the light then propagates through the receiving fibers, and is detected by light sensing means. Thus, the intensity of the light coupled into the receiving fibers modulates in a proportional relationship to the electric field or voltage applied to the conductors and is measured by the sensor. In an alternative embodiment, only a single conductor is connected to a voltage source and the second conductor is connected to ground. In this alternative embodiment the conductors carry opposite charges, the conductors exhibit a displacement force that is both linear and proportional to the applied voltage.

A preferred method of selecting the optical fiber, constructing the fiber optic probe, and a preferred method for determining the optimal distance to position the probe from the reflective arc that is attached to a material that experiences a physical displacement in response to the electromagnetic phenomena is described in detail in the description of FIG. 1 and are similarly employed here. The same method of probe construction and positioning is used in this embodiment. In another embodiment a single fiber may be used as both the transmitting and receiving fiber. In this embodiment the light source and the means for sensing the received light are both coupled to the fiber end. The light is launched from the fiber into the reflective surface and is reflected back into the same fiber. In yet another embodiment, the fiber probe may contain a single transmit fiber and a single receive fiber. However, any combination of fibers may be used to form the probe.

7) Fiber Optic Electric Field Sensor Measuring Ionic Attraction Forces

In an alternative embodiment, the fiber optic electromagnetic phenomena sensor measures the displacement in a material that is created by electrostatic attraction between two materials, the displacement being indicative of the electric field or voltage. In this embodiment, a leaf of aluminum is suspended over, but not in contact with, a conductive plate containing NaCl crystals. A voltage is applied to the conductive plate, charging the NaCl crystals. The charged crystals cause the aluminum leaf to become attracted to the charged crystals, causing a displacement in the aluminum material.

Figure 13:
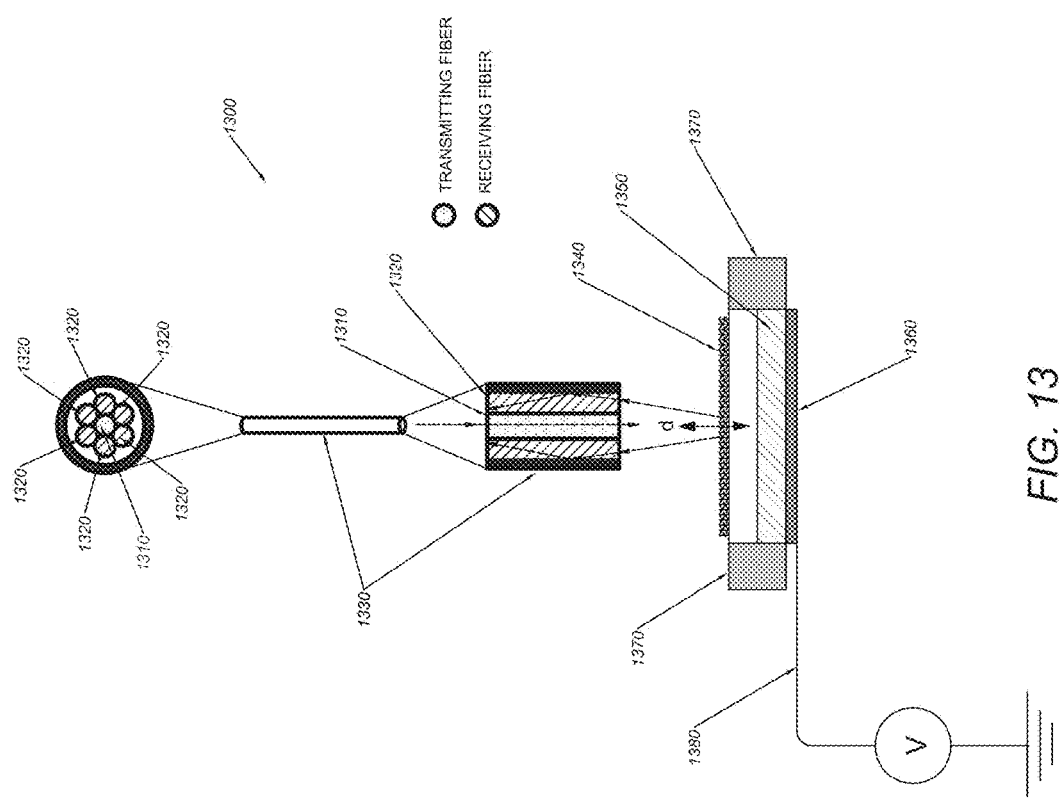
FIG. 13 shows an embodiment of a fiber optic electromagnetic phenomena sensor, configured to measure voltage.

FIG. 13 shows an embodiment of an electromagnetic fiber optic sensor 1300 featuring a fiber probe 1330 and a material that exhibits a physical displacement in response to an electromagnetic field, with the displacement caused by the electrostatic attraction between two materials, the displacement being indicative of electric field or voltage.

A fiber bundle 1330 featuring a transmitting fiber 1310 having a first and second ends is placed adjacent to a reflective surface 1340. The first end has a polished finish and the second end is coupled to a light source (not shown). The sensor uses an LED emitting at 850 nm as the light source with a silicon PIN diode as the light sensing means (not shown). The fiber bundle also features a multitude of receiving fibers 1320 disposed around the transmitting fiber with each receiving fiber having first and second ends where the first ends are also polished and the second ends are coupled to the light detecting means. The fiber bundle 1330 is constructed and arranged as described in FIG. 1 above, to form a multi-fiber probe. The fiber bundle is inserted into a tubing 1330 so the fiber bundle is contained within the tube, forming a probe. The fiber probe is positioned such that the first end of the transmitting fiber and the first end of each receiving fiber is adjacent to the reflective side 1340 of the material to be measured that exhibits a physical displacement when a voltage is applied, with space between the first fiber end and the reflective side of the material.

The material 1340 that exhibits a physical displacement in response to an introduced electric field (or voltage) is a leaf of thin aluminum. In this embodiment, the aluminum is spaced suspended over, but not in contact with, a conductive plate 1360 containing NaCl crystals 1350. Ceramic supports 1370 serve to maintain a separation of the conductive plate and the crystals from the aluminum leaf. A voltage is applied to the conductive plate 1380, charging the NaCl crystals. The ionically charged crystals cause the aluminum leaf to become attracted to the charged crystals, causing a displacement in the aluminum material towards the crystals, in a manner proportional to the electric field or voltage applied.

In operation, an electric field, or voltage denoted "V", is introduced to the conductive plate 1360 from a voltage source 1380. The introduction of a voltage in the material will cause the crystals to charge and attract the aluminum leaf. As a result of the force of ionic attraction, the force creates a physical displacement in the foil towards the crystals proportional of the strength of the electric field applied. In parallel, light from the light source is launched into the transmitting fiber propagates through the transmitting fiber, emerges at the opposite end of the probe, propagates a short distance, and is reflected by the reflective surface of the conductor and into the receiving fibers, the light then propagates through the receiving fibers, and is detected by light sensing means. Thus, the intensity of the light coupled into the receiving fibers modulates in a proportional relationship to the electric field or voltage that is passed through the crystals and is measured by the sensor.

A preferred method of selecting the optical fiber, constructing the fiber optic probe, and a preferred method for determining the optimal distance to position the probe from the reflective arc that is attached to a material that experiences a physical displacement in response to the electromagnetic phenomena is described in detail in the description of FIG. 1 and are similarly employed here. The same method of probe construction and positioning is used in this embodiment. In another embodiment a single fiber may be used as both the transmitting and receiving fiber. In this embodiment the light source and the means for sensing the received light are both coupled to the fiber end. The light is launched from the fiber into the reflective surface and is reflected back into the same fiber. In yet another embodiment, the fiber probe may contain a single transmit fiber and a single receive fiber. However, any combination of fibers may be used to form the probe.

8) Evaluation of Single Fiber and Multiple Fiber Probe Embodiments

The fiber optic probe of any of the embodiments described herein may consist of one or more optical fibers. The measurement sensitivity of sensors using such a probe can be determined and set by establishing a set probe-reflector distance depending on the method of fiber optic probe construction employed. It will be appreciated, however, that any combination of number of fibers may be used to construct the probe and select the distance between the probe and the reflector based upon the concepts described.

Figure 14:
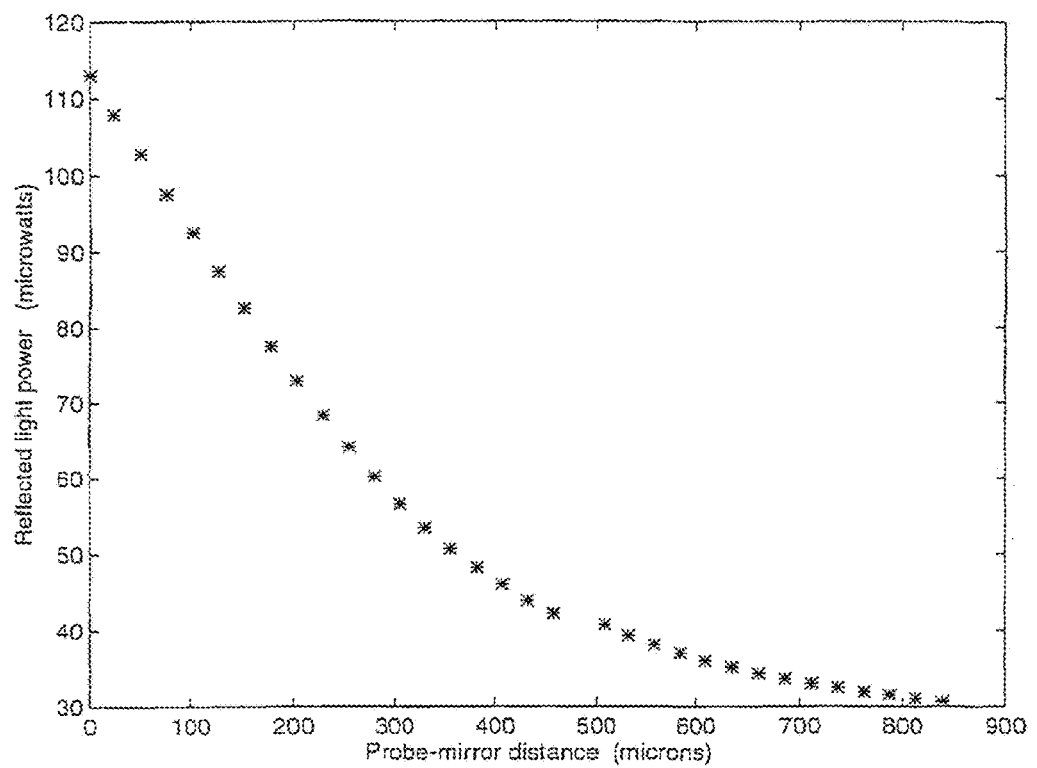
FIG. 14 illustrates the dc displacement sensitivity of a one-fiber probe sensor versus the probe end to reflector distance.

FIG. 14 illustrates the displacement sensitivity of a one-fiber probe, which may be part of any of the embodiments disclosed herein, including those displayed in FIGS. 1 to 5. The displacement sensitivity of the one fiber probe can be studied by mounting it on a micrometer translator which can be displaced manually against a mirror mounted on a piezoelectric transducer (PZT4 cylinder of 2 inch outer diameter and 3 inch length) which can be vibrated electrically. The probe is displaced manually against the mirror in steps of 25.4 µm using a micrometer translator. Results are shown in FIG. 14 where the power of the reflected light coupled into the same fiber is plotted vs. the probe-reflector distance. As can be seen from this figure, maximum displacement sensitivity is achieved in the 0-150 µm probe-reflector distance.

Figure 15:
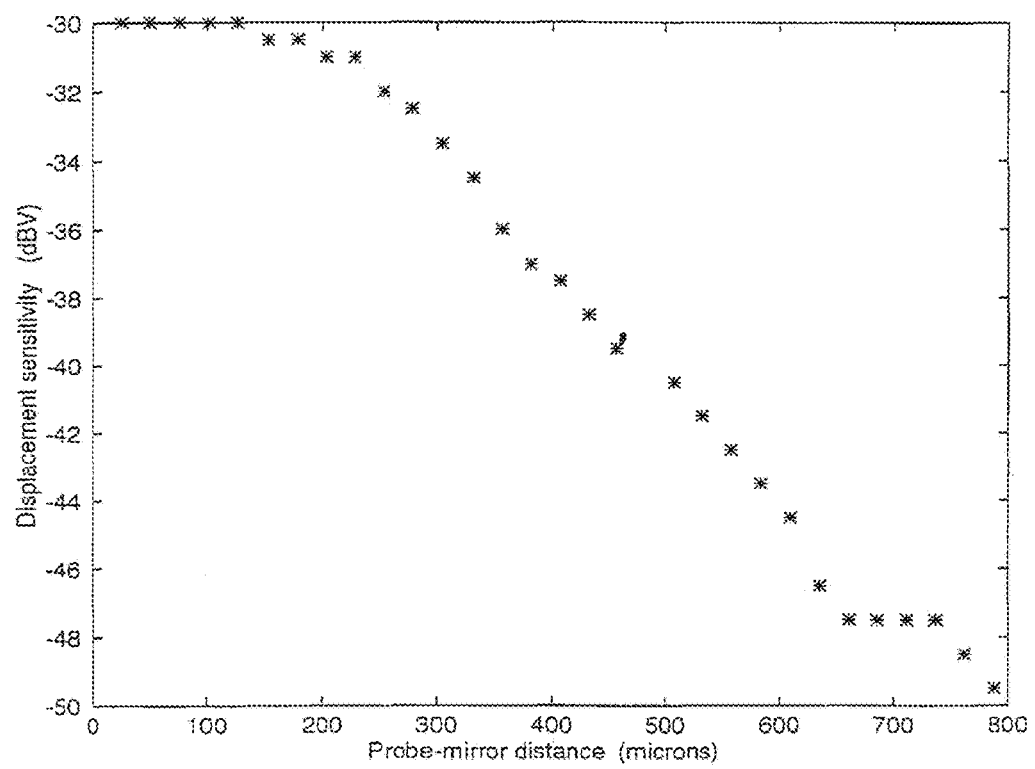
FIG. 15 illustrates the ac displacement sensitivity of a one-fiber probe sensor versus the probe end to reflector distance.

The one fiber probe can also be dynamically displaced against the mirror by vibrating the PZT transducer electrically. The displacement amplitude of the vibrating mirror can be obtained from the output of a reference accelerometer mounted close to the mirror. Results are shown in FIG. 15, which shows the ac displacement sensitivity as a function of the probe-mirror distance. As can be seen from this figure, the sensitivity is maximum and approximately constant in the 0-150 µm region, in agreement with the dc displacement results of FIG. 14. These results illustrate that an optimum operating distance of the one fiber probe end from the reflecting surface is about 60 µm and the optimum operating region is 0-120 µm, for this type of fiber probe embodiment, although other operating distances can be used.

Figure 16:
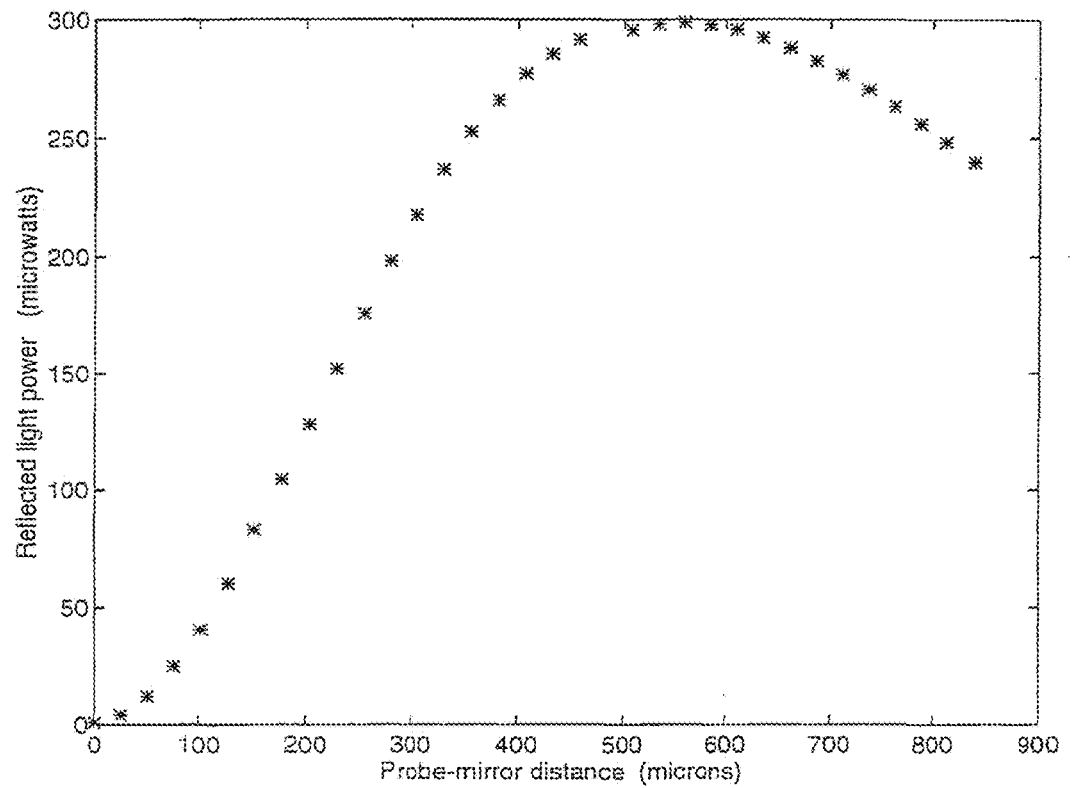
FIG. 16 illustrates the dc displacement sensitivity of a seven fiber probe sensor versus the probe end to reflector distance.

FIG. 16 illustrates the dc displacement sensitivity of the 7 fiber probe, which was studied in a similar way to that of the one-fiber probe. In FIG. 16, the reflected light power coupled into the 6 receiving fibers is plotted vs. the probe-mirror distance. The maximum displacement sensitivity is achieved for a probe-mirror distance of about 180-250 µm and is about $9.38 \times 10^{-11}$ W/A, where A is equal to $10^{-8}$ cm. By comparing the results in FIGS. 14 and 16, it is seen that the region of maximum sensitivity of the seven fiber probe is different than that of the single fiber probe. For example, the maximum sensitivity region for the one fiber probe is found at close to zero probe-mirror distance, while the maximum sensitivity region for the seven fiber probe, the maximum sensitivity is achieved at a greater distance. Another difference is that with the seven fiber probe, significantly higher light power is detected. This is believed to be due primarily to the coupler used in the one fiber probe which reduces the power by at least about 50%.

Figure 17:
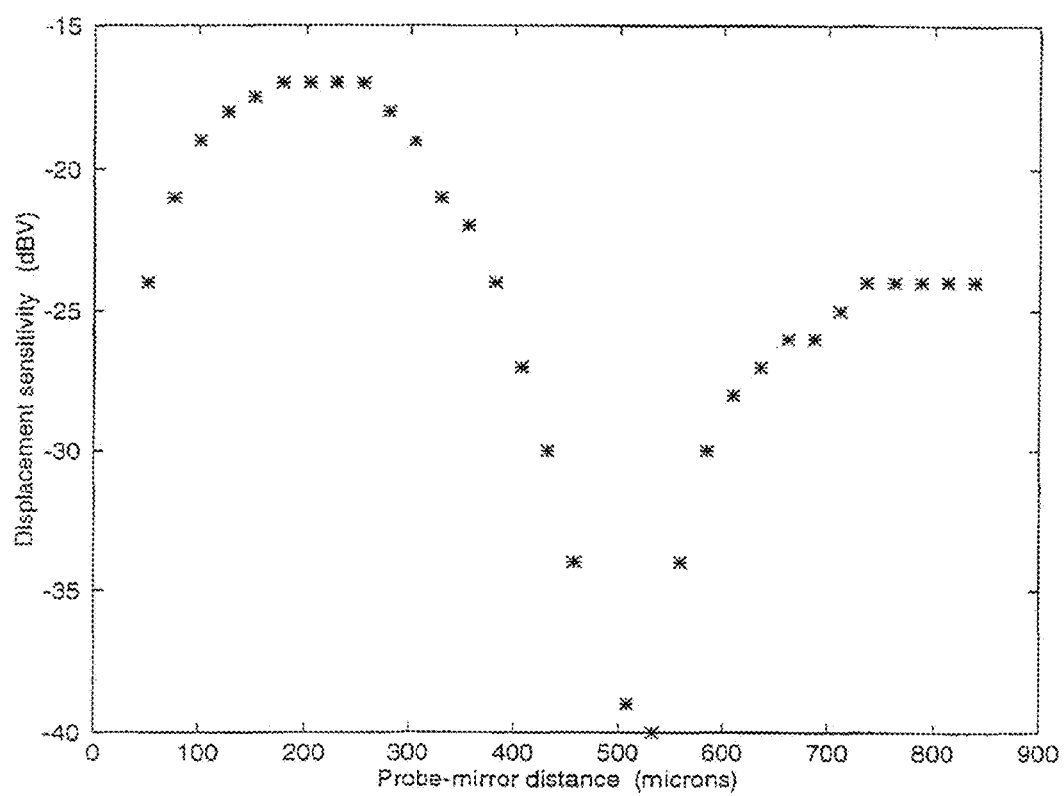
FIG. 17 illustrates the ac displacement sensitivity of a seven fiber probe sensor versus the probe end to reflector distance.

FIG. 17 illustrates the displacement sensitivity plotted as a function of the probe mirror distance for the seven-fiber probe. These results were obtained in a similar way as the FIG. 15 results for the one-fiber probe. As can be seen from this figure, maximum displacement sensitivity is achieved in the probe-mirror distance range of 180-250 µm, in agreement with the dc displacement results of FIG. 15. This maximum displacement sensitivity range indicates that an optimum probe-reflecting surface distance can be about 220 µm. From FIGS. 17 and 15, it is apparent that the maximum ac displacement sensitivity of the seven fiber probe is about 13 dB higher than that of the one fiber probe. Thus, the increased sensitivity difference and the high cost of the multimode coupler used in the one fiber probe make a seven-fiber probe sensor better for some applications than a one fiber probe sensor, even though the one fiber probe sensor uses only one fiber instead of seven. In other applications, for example, in remote sensing applications in which longer fiber lengths are needed, a one-fiber probe sensor can be a better choice.

Based on the results shown in FIG. 17, the displacement sensitivity of the 7 fiber probe was calculated from the signals of the probe and the reference accelerometer and was found to be equal to $6.35 \times 10^{-11}$ W/A. This result is slightly less than the $9.35 \times 10^{-11}$ W/A sensitivity calculated from the dc displacement procedure, the results of which are shown in FIG. 16. Typically, a good PIN detector can detect a fraction of a picowatt ac signal, the minimum detectable displacement limited by the detector noise is: minimum detectable displacement >0.01 A. Using the information discerned from FIGS. 14 to 17, the reflecting material of a sensor construction can be placed at an optimum distance from the probe end for maximum sensitivity. The sensors described in FIGS. 1 to 13 can be constructed to position the probe at an optimum reflector-probe end distance. The optimum reflector-probe end distance can be found in practice by adjusting the distance, monitoring the detected light from the receiving fibers, and taking into account the FIG. 16 and FIG. 17 calibration for the seven fiber probe. Similarly, FIGS. 14 and 15 can be used to determine the optimum probe end-reflector distance for a one-fiber probe.

Each of the embodiments described above describes a particular method for measuring the presence and magnitude of electromagnetic phenomena, with embodiments that can be selected whereby the electric or magnetic field, voltage, or current is isolated for measurement, although many other variations or modifications can be envisioned whereby a material that experiences a similar physical displacement due to an electromagnetic phenomena can be measured.

Although this invention has been described in relation to the exemplary embodiments, it is well understood by those skilled in the art that other variations and modifications can be affected on the preferred embodiments without departing from the scope and spirit of the invention as set forth herein and within the claims.

The invention claimed is:

1. A fiber optic sensor for measuring electromagnetic phenomena, comprising:
   an optical fiber probe including
      at least one transmitting fiber having one end coupled to a light source and at least
      one receiving fiber having one end coupled to a light sensing means;
   a material that experiences a physical displacement in response to an electromagnetic phenomena, the material having a reflective surface or a reflective body attached thereto;
   the fiber probe being positioned such that the uncoupled end of the fibers are adjacent to the reflective surface with space between the fibers and the reflective surface;
   wherein, light transmitted through the transmitting fiber emerges at the uncoupled end, propagates a short distance, and is reflected by the reflective surface into the at least one receiving fiber, and is detected by a light sensing means, upon a physical displacement in the material in response to the electromagnetic phenomena causing a change in the distance between the fiber ends and the reflective surface, and the change in the distance modulating the amount of light reflected into the at least one receiving fiber.

2. The sensor in claim 1, wherein the at least one transmitting fiber and the at least one receiving fiber are the same fiber, with one end being coupled to a light source and a light sensing means and the second end being adjacent to the reflective surface with space between the fiber and the reflective surface.

3. The sensor in claim 1, wherein the sensor measures voltage.

4. The sensor in claim 1, wherein the sensor measures electric current.

5. The sensor in claim 1, wherein the sensor measures magnetic fields.

6. The sensor in claim 1, wherein the sensor measures electric fields.

7. The sensor of claim 1, wherein a plurality of receiving fibers are used.

8. The sensor of claim 1, wherein the at least one receiving fiber consists of six fibers arranged surrounding the transmitting fiber.

9. The sensor in claim 1, wherein the at least one transmitting fiber and at least one receiving fiber are multimode fibers.

10. The sensor in claim 7, wherein the plurality of receiving fibers are multimode fibers.

11. The sensor in claim 1, wherein the physical displacement of the material is caused by the Lorentz force.

12. The sensor in claim 1, wherein the physical displacement of the material is caused by the piezoelectric effect.

13. The sensor in claim 1, wherein the physical displacement of the material is caused by the magnetostrictive effect.

14. The sensor in claim 1, wherein the physical displacement of the material is caused by the force explained by Coulomb's Law.

15. The sensor in claim 1, wherein the physical displacement is caused by the electrostatic attraction between oppositely charged materials.

16. The sensor in claim 11, where the material is a conductor.

17. The sensor in claim 11, where the material is a conductive wire or strip.

18. The sensor in claim 12, wherein the material used has piezoelectric properties.

19. The sensor in claim 12 wherein the piezoelectric material comprises barium titanate, lead titanate, ZnO, lead zirconate titanate (PZT), lead lanthanum zirconate titanate, lead magnesium niobate, quartz, tourmaline, or polyvinylidene fluoride (PVDF).

20. The sensor in claim 13, wherein the material used has magnetostrictive properties.

21. The sensor in claim 13 wherein the magnetostrictive material comprises nickel, cobalt, galfenol, or terfenol-d.

22. The sensor in claim 14, wherein the material is a conductor consisting of two conductive plates positioned parallel to one another.

23. The sensor in claim 15, wherein the mechanical displacement is due to the force caused by the electrostatic attraction between two oppositely charged materials, such as aluminum and electrically charged NaCl.

24. The sensor in claim 1, wherein the material that experiences a physical displacement in response to an electromagnetic phenomena has a reflective layer or coating to enhance its light reflective properties.

25. The sensor in claim 1, wherein the space between the fiber probe and reflective surface is filled with a gas.

26. The sensor in claim 25, wherein the space between the fiber probe and reflective surface is filled with air, nitrogen, or $SF_6$.

27. The sensor in claim 1, wherein the space between the fiber probe and reflective surface is filled with a liquid.

28. The sensor in claim 1, wherein the reflective body affixed to the material is constructed in a manner wherein the reflective material displaces proportionally and in a direction perpendicular to the physical displacement of the material.

29. The sensor in claim 12, wherein the reflective body affixed to the material is constructed in a manner wherein the reflective material displaces proportionally and in a direction perpendicular to the physical displacement of the material.

30. The sensor in claim 13, wherein the reflective body affixed to the material is constructed in a manner wherein the reflective material displaces proportionally and in a direction perpendicular to the physical displacement of the material.

31. The sensor in claim 1, including a housing for the fiber optic probe, the material, and the reflective surface.

32. The sensor in claim 1, wherein the transmitting and receiving fibers are encased within a protective tubing.

33. The sensor in claim 32, wherein the tubing is dielectric.

34. The sensor in claim 31, wherein the housing is sealed from exterior contamination.

35. The sensor in claim 31, wherein the housing is constructed of dielectric material.

36. The sensor in claim 31, wherein the housing is constructed of a metal.

37. The sensor of claim 31, wherein the housing and reflector body are free of metals.

38. The sensor in claim 31, wherein the housing comprises means to set the distance between the fiber probe and the reflective material.

39. The sensor in claim 1, wherein the light source is a light emitting diode or a laser.

40. The sensor in claim 1, wherein in the light sensing means is at least one of a PIN detector, a photodiode, a photomultiplier tube, or a semiconductor-metal detector.

41. The sensor in claim 1, wherein the distance between the fiber probe and the reflective material or body is in a range of 0 to 500 microns.

* * * * *